US010312252B2

(12) United States Patent
Kawashima

(10) Patent No.: US 10,312,252 B2
(45) Date of Patent: Jun. 4, 2019

(54) METHOD OF MANUFACTURING SEMICONDUCTOR DEVICE

(71) Applicant: Renesas Electronics Corporation, Tokyo (JP)

(72) Inventor: Yoshiyuki Kawashima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 16 days.

(21) Appl. No.: 15/486,741

(22) Filed: Apr. 13, 2017

(65) Prior Publication Data

US 2017/0330891 A1    Nov. 16, 2017

(30) Foreign Application Priority Data

May 11, 2016    (JP) .................................. 2016-095047

(51) Int. Cl.
| | | |
|---|---|---|
| H01L 29/08 | (2006.01) | |
| H01L 21/28 | (2006.01) | |
| H01L 27/11568 | (2017.01) | |
| H01L 21/265 | (2006.01) | |
| H01L 21/324 | (2006.01) | |
| H01L 27/11573 | (2017.01) | |
| H01L 29/423 | (2006.01) | |
| H01L 29/66 | (2006.01) | |
| H01L 29/792 | (2006.01) | |

(52) U.S. Cl.
CPC .. *H01L 27/11568* (2013.01); *H01L 21/26513* (2013.01); *H01L 21/28008* (2013.01); *H01L 21/324* (2013.01); *H01L 27/11573* (2013.01); *H01L 29/0847* (2013.01); *H01L 29/42344* (2013.01); *H01L 29/66568* (2013.01); *H01L 21/28282* (2013.01); *H01L 29/665* (2013.01); *H01L 29/6659* (2013.01); *H01L 29/66833* (2013.01); *H01L 29/792* (2013.01)

(58) Field of Classification Search
USPC ........................................................ 438/275
See application file for complete search history.

(56) References Cited

U.S. PATENT DOCUMENTS

2008/0150023 A1    6/2008  Nishisaka
2012/0132978 A1*   5/2012  Toba ................. H01L 21/28282
                                                  257/316

(Continued)

FOREIGN PATENT DOCUMENTS

JP    11-144483 A    5/1999
JP    2008-153567 A  7/2008

*Primary Examiner* — Timor Karimy
(74) *Attorney, Agent, or Firm* — McDermott Will & Emery LLP

(57) ABSTRACT

A method of manufacturing a semiconductor device having a memory cell for a split-gate MONOS memory with a halo region, which prevents miswriting in the memory cell and worsening of short channel characteristics. In the method, a first diffusion layer of a drain region and a second diffusion layer of a source region in the memory cell for the MONOS memory are formed in different ion implantation steps. The steps are carried out so that the first diffusion layer has a smaller formation depth than the second diffusion layer. After the formation of the layers, the impurities inside the first and second diffusion layers are diffused by heat treatment to form a first diffusion region and a second diffusion region.

13 Claims, 23 Drawing Sheets

(56) References Cited

U.S. PATENT DOCUMENTS

2015/0035034 A1\* 2/2015 Winstead .......... H01L 29/66833
257/314
2017/0125252 A1\* 5/2017 Strachan ............. H01L 29/7831

\* cited by examiner

METHOD OF MANUFACTURING SEMICONDUCTOR DEVICE

CROSS-REFERENCE TO RELATED APPLICATIONS

The disclosure of Japanese Patent Application No. 2016-095047 filed on May 11, 2016 including the specification, drawings and abstract is incorporated herein by reference in its entirety.

BACKGROUND

The present invention relates to a method of manufacturing a semiconductor device and for example, to a method of manufacturing a semiconductor device having a nonvolatile memory.

EEPROMs (Electrically Erasable and Programmable Read Only memories) are widely used as nonvolatile semiconductor storage devices which electrically enable writing and erasing. Such storage devices, typified by flash memories which are widely used at present, have a conductive floating gate electrode surrounded by an oxide film or trap insulating film under the gate electrode of a MISFET, in which the state of charge storage in the floating gate or trap insulating film is taken as storage information and read as a transistor threshold. The trap insulating film refers to an insulating film which can store a charge and one such example is a silicon nitride film. The threshold of the MISFET is shifted by charge injection into, or charge emission from, such charge storage region so that the MISFET operates as a storage element. Among the nonvolatile semiconductor storage devices which use a trap insulating film are split-gate cells which use a MONOS (Metal Oxide Nitride Oxide Semiconductor) film.

In the category of MISFETs (Metal Insulator Semiconductor Field Effect Transistors), as a technique to prevent generation of hot carriers due to a high electric field, it is known that the source and drain regions have an LDD structure which includes a semiconductor region with a low impurity concentration and a semiconductor region with a high impurity concentration.

Japanese Unexamined Patent Application Publication No. 2008-153567 describes that a MOSFET (Metal Oxide Semiconductor Field Effect Transistor) is formed over a SOI (Silicon On Insulator) substrate. In this technique, the source diffusion layer of the MOSFET has a higher impurity concentration than its drain diffusion layer.

Japanese Unexamined Patent Application Publication No. 1999-144483 describes that in a memory cell as a MOS (Metal Oxide Semiconductor) transistor, the drain region extends more widely than the source region.

SUMMARY

In the category of split-gate memory cells, with the tendency toward miniaturization of memory cells, the problems to be solved are worsening of short channel characteristic and the increase in miswriting. However, these problems are in a trade-off relation and it is difficult to improve both the problems.

The above and further objects and novel features of the invention will more fully appear from the following detailed description in this specification and the accompanying drawings.

One of the main aspects of the present invention which will be disclosed herein is briefly outlined next.

According to one aspect of the present invention, there is provided a method of manufacturing a semiconductor device which includes the steps of making a memory cell with a halo region on the drain region side for a split-gate MONOS memory, in which the source region of the memory cell has a larger depth than its drain region.

According to the present invention, the performance of the semiconductor device is enhanced.

DETAILED DESCRIPTION

Figure 1:
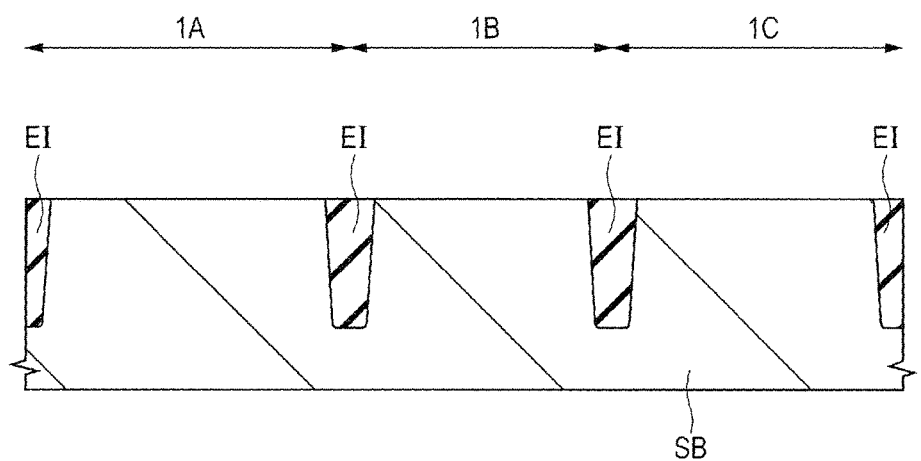
FIG. 1 is a sectional view of a step in a semiconductor device manufacturing process according to a first embodiment of the present invention.

Next, the preferred embodiments of the present invention will be described in detail referring to the accompanying drawings. In all the drawings that illustrate the preferred embodiments, the members with the same functions are designated by the same reference signs and their descriptions are not repeated. Basically, the same or similar elements or matters are not repeatedly explained below unless necessary.

Signs "−" and "+" denote relative concentrations of impurities of n-type or p-type conductivity; for example, in the case of n-type impurities, "n$^+$" denotes a higher impurity concentration than "n$^-$".

First Embodiment

In a first embodiment and other preferred embodiments described below, the semiconductor device has a nonvolatile memory (nonvolatile storage element, flash memory, nonvolatile semiconductor storage device). The nonvolatile memory in the first embodiment and other preferred embodiments will be explained below on the assumption that the memory cell is based on an n-channel MISFET (Metal Insulator Semiconductor Field Effect Transistor).

In the explanation of the first embodiment and other preferred embodiments which is given below, polarity (polarity of the applied voltage for writing, erasing, or reading, or carrier polarity) will be indicated in order to explain the operation of a memory cell based on an n-channel MISFET. If the memory cell is based on a p-channel MISFET, in principle the same memory cell operation can be performed by reversing all the polarities of the applied voltages and carrier conductivity.

<Semiconductor Device Manufacturing Method>

Next, the steps of the method of manufacturing a semiconductor device according to the first embodiment will be described in the sequence in which the steps should be carried out, referring to FIGS. 1 to 17. FIGS. 1 to 17 are sectional views of various steps in the semiconductor device manufacturing process according to the first embodiment.

Here, an explanation is given of the steps of forming a nonvolatile memory cell, n-channel low-voltage MIS transistor, and n-channel high-voltage MIS transistor among various elements formed over the main surface of the semiconductor substrate SB. The nonvolatile memory cell is, for example, a split-gate cell which uses a MONOS film. The low-voltage MIS transistor is, for example, a low-voltage MIS transistor which constitutes a CPU formed in a logical operation circuit module. The high-voltage MIS transistor is, for example, a high-voltage MIS transistor which constitutes a power supply circuit for supplying high voltage to the nonvolatile memory module.

In the explanation given below, the region in which a nonvolatile memory cell is formed is called memory cell region 1A, the region in which a low-voltage MIS transistor is formed is called low-voltage MIS region 1B, and the region in which a high-voltage MIS transistor is formed is called high-voltage MIS region 1C. In FIGS. 1 to 17, the memory cell region 1A, low-voltage MIS region 1B, and high-voltage MIS region 1C are shown from left to right.

First of all, for example, a semiconductor substrate SB of p-type monocrystalline silicon with a resistivity of about 1 Ωcm to 10 Ωcm is provided as shown in FIG. 1. Alternatively, a semiconductor substrate SB which does not use silicon may be used.

Then, element isolation areas EI are formed in the main surface of the semiconductor substrate SB. For example, element isolation areas EI are formed by making isolation trenches in the semiconductor substrate SB and burying an insulating film such as silicon film in each isolation trench. This element isolation method is called the STI (Shallow Trench Isolation) method. Alternatively, the LOCOS (Local Oxidization of Silicon) method may be used to make element isolation areas EI. The thickness of an element isolation area EI is, for example, from 200 nm to 400 nm or so.

Figure 2:
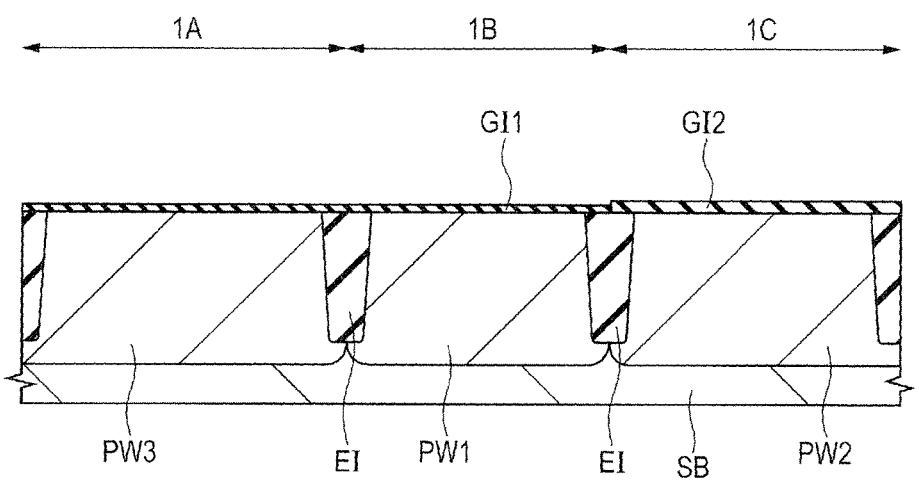
FIG. 2 is a sectional view of a step next to the step shown in FIG. 1 in the semiconductor device manufacturing process.

Next, a p-type well PW1, p-type well PW2, and p-type well PW3 are formed in the low-voltage MIS region 1B, high-voltage MIS region 1C, and memory cell region 1A of the semiconductor substrate SB, respectively as shown in FIG. 2. The p-type wells PW1, PW2, and PW3 are formed by implanting p-type impurity ions (for example, B (boron)). Furthermore, a channel region is formed in the main surface of the semiconductor substrate SB in each of the memory cell region 1A, low-voltage MIS region 1B, and high-voltage MIS region 1C, by implanting p-type impurities (for example, B (boron)) using the ion implantation technique, though not shown.

Then, after cleaning the surface of the semiconductor substrate SB (p-type wells PW1, PW2, and PW3) by DHF (diluted hydrofluoric acid) cleaning or a similar method, an insulating film GI1 is formed on the main surface (surfaces of the p-type wells PW1 and PW3) of the semiconductor substrate SB in the low-voltage MIS region 1B and memory cell region 1A and an insulating film GI2 is formed on the main surface (surface of the p-type well PW2) of the semiconductor substrate SB in the high-voltage MIS region 1C. The thickness of the insulating film GI1 is, for example, 2 nm to 3 nm and the thickness of the insulating film GI2 is, for example, 10 nm to 15 nm.

The insulating films GI1 and GI2 are, for example, a silicon oxide film made by thermal oxidation, but another type of insulating film such as oxynitride silicon film may be used. Alternatively, a metal oxide film having a higher permittivity than silicon nitride film, such as hafnium oxide film, aluminum oxide film (alumina) or tantalum oxide film, or a laminated film of oxide film and metal oxide film may be formed. Instead of the thermal oxidation technique, the CVD (Chemical Vapor Deposition) technique may be adopted. Alternatively, the insulating film GI1 and insulating film GI2 may be different in film type.

Figure 3:
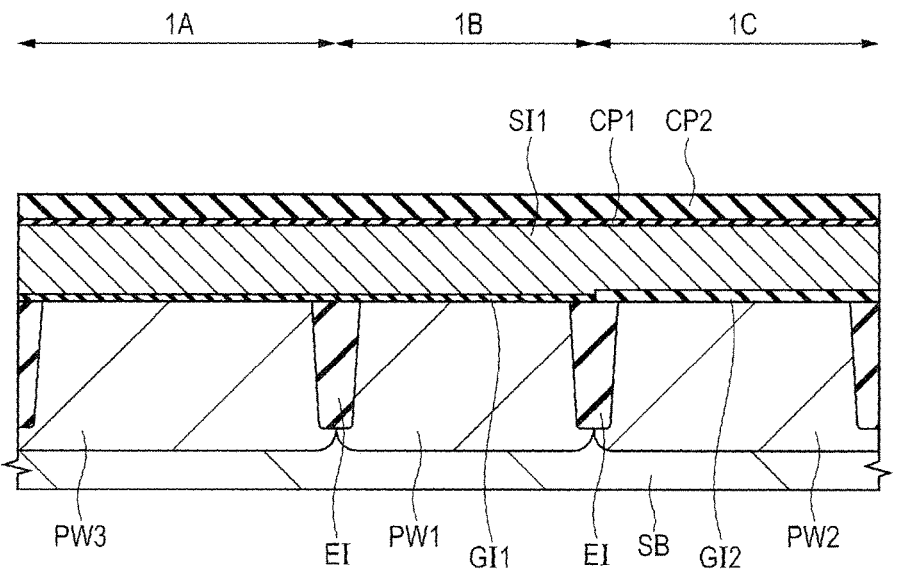
FIG. 3 is a sectional view of a step next to the step shown in FIG. 2 in the semiconductor device manufacturing process.

Next, a silicon film SI1 as a conductive film is formed over the entire surface of the semiconductor substrate SB as shown in FIG. 3. The thickness of the silicon film SI1 is, for example, 50 nm to 150 nm or so. This silicon film SI1 may be a polycrystalline silicon film made, for example, by the CVD technique. Alternatively, the silicon film SI1 may be formed by depositing an amorphous silicon film and crystallizing it by heat treatment (crystallization). The silicon film SI1 will be used for the gate electrode of a low-voltage MIS transistor in the low-voltage MIS region 1B, the gate electrode of a high-voltage MIS transistor in the high-voltage MIS region 1C, and the control gate electrode of a nonvolatile memory cell in the memory cell region 1A.

Then, n-type impurities (for example, P (phosphorus) or As (arsenic)) are implanted into the silicon film SI1 in the memory cell region 1A.

Then, a silicon oxide film (cap insulating film) CP1 is formed over the silicon film SI1 by thermally oxidizing the surface of the silicon film SI1. The thickness of the silicon oxide film CP1 is, for example, 3 nm to 10 nm or so. Alternatively, the silicon oxide film CP1 may be formed by the CVD technique.

Then, a silicon nitride film (cap insulating film) CP2 is formed over the silicon oxide film CP1 by the CVD technique, etc. The thickness of the silicon nitride film CP2 is, for example, 50 nm to 150 nm or so.

Figure 4:
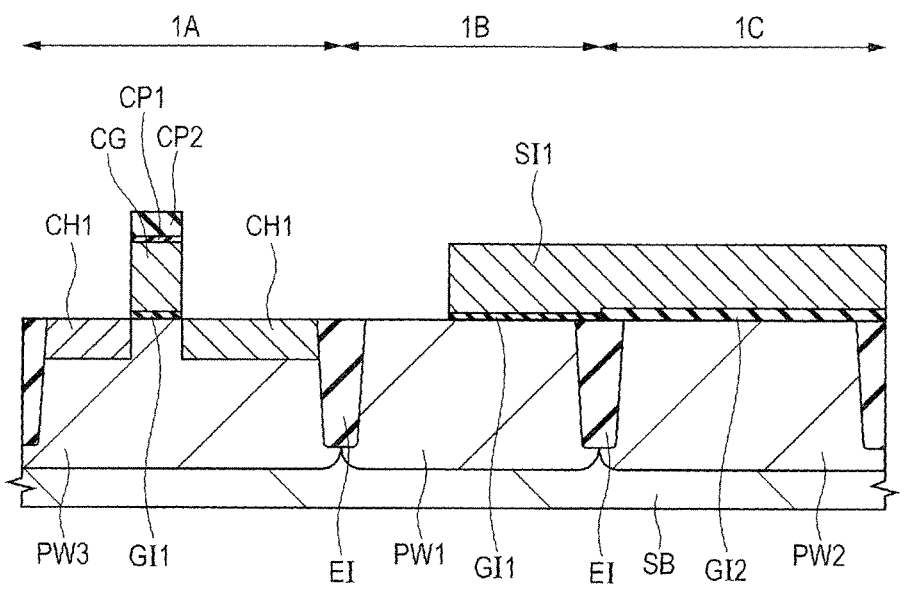
FIG. 4 is a sectional view of a step next to the step shown in FIG. 3 in the semiconductor device manufacturing process.

Next, referring to FIG. 4, a photoresist film (not shown) is formed by the photolithographic technique in the portion of the memory cell region 1A in which the control gate electrode CG is to be formed, the low-voltage MIS region 1B, and the high-voltage MIS region 1C, and using the photoresist film as a mask, etching is done on the silicon nitride film CP2, silicon oxide film CP1, silicon film SI1, and insulating film GI1 in the memory cell region 1A. After that, the photoresist film is removed by asking, etc. to form the control gate electrode CG based on the silicon film SI1 (for example, with a gate length of about 80 nm) in the memory cell region 1A.

In the memory cell region 1A, the main surface portion of the semiconductor substrate SB beside the control gate electrode CG is exposed at least from the silicon nitride film CP2, silicon oxide film CP1 and silicon film SI1. In this case, the main surface portion of the semiconductor substrate SB is also exposed from the insulating film GI1. In the memory cell region 1A, the insulating film GI1 remaining under the control gate electrode CG is to become the gate insulating film of the control transistor to be formed later.

Then, the silicon nitride film CP2 and silicon oxide film CP1 in the low-voltage MIS region 1B and high-voltage MIS region 1C are removed.

Since the cap insulating films (silicon nitride film CP2 and silicon oxide film CP1) lie over the control gate electrode CG, the height of the control gate electrode area (lamination of the control gate electrode CG and cap insulating films) is relatively large. Consequently, a memory gate electrode MG (which will be described later) can be formed into an adequate shape in a highly controllable manner. Specifically, the sidewall of the memory gate MG in the form of a side wall can be virtually perpendicular to the main surface of the semiconductor substrate SB.

Then, a channel region CH1 is formed in the main surface of the semiconductor substrate SB in the memory cell region 1A by implanting n-type impurities (for example, P (phosphorus) or As (arsenic)) using the silicon nitride film CP2 and silicon film SI1 as a mask (mask to prevent impurity implantation) by the ion implantation technique. A pair of channel regions CH1 are formed in the main surface of the semiconductor substrate SB on both sides of the control gate electrode CG. In the present invention, in addition to the channel regions CH1, the regions including the main surface portions of the semiconductor substrate SB just beneath the control gate electrode and memory gate electrode (which will be formed later) may be also called channel regions.

Figure 5:
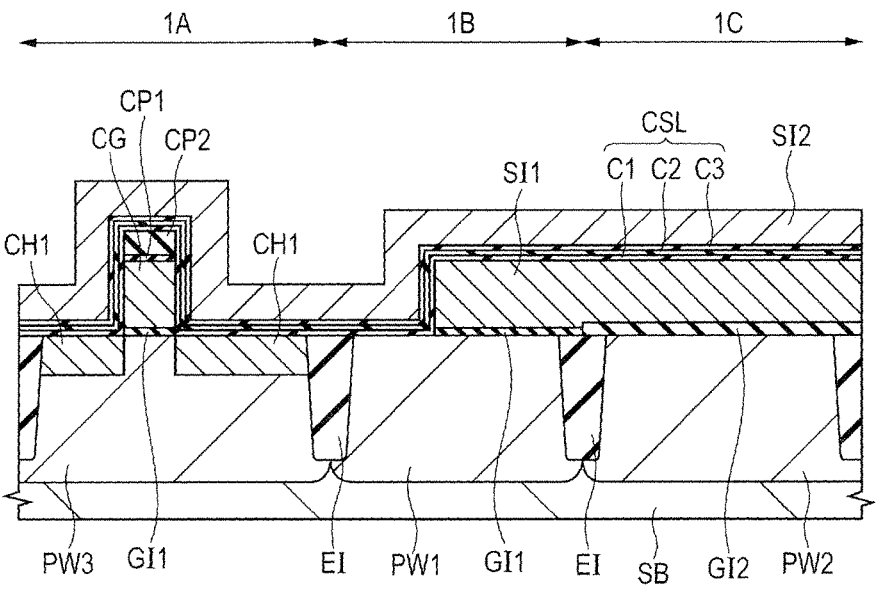
FIG. 5 is a sectional view of a step next to the step shown in FIG. 4 in the semiconductor device manufacturing process.

Next, as shown in FIG. 5, an insulating film CSL (C1, C2, and C3) is formed over the semiconductor substrate SB including the upper surfaces of the silicon nitride film CP2 and silicon film SI1 in accordance with the following procedure.

First, after cleaning the main surface of the semiconductor substrate SB, a silicon oxide film (bottom oxide film) C1 is formed over the semiconductor substrate SB including the upper surfaces of the silicon nitride film CP2 and silicon film SI1. The silicon oxide film C1 is formed, for example, by the thermal oxidation technique (preferably ISSG (In Situ Steam Generation) oxidation) and its thickness is, for example, about 4 nm. Alternatively, the silicon oxide film C1 may be formed by the CVD technique.

Then, a silicon nitride film C2 is formed over the silicon oxide film C1. The silicon nitride film C2 is formed, for example, by the CVD technique and its thickness is, for example, about 10 nm. The silicon nitride film C2 is to become the charge accumulation area of the nonvolatile memory cell and the middle layer of the insulating film (ONO film) CSL.

Then, a silicon oxide film (top oxide film) C3 is formed over the silicon nitride film C2. The silicon oxide film C3 is formed, for example, by the CVD technique and its thickness is, for example, about 5 nm.

The insulating film CSL as an ONO (Oxide Nitride Oxide) film, which includes the silicon oxide film C1, silicon nitride film C2, and silicon oxide film C3, is formed by taking the above steps.

In this embodiment, the silicon nitride film C2 is used as the charge accumulation area (charge accumulation layer, insulating film with a trap level) inside the insulating film CSL. However, another type of insulating film such as silicon oxynitride film, aluminum oxide film, hafnium oxide film or tantalum oxide film may be used. These films are high-permittivity films which have higher permittivity than the silicon nitride film. Alternatively, the charge accumulation layer may be formed using an insulating film with silicon nano-dots.

The insulating film CSL formed in the memory cell region 1A functions as the gate insulating film of the memory gate electrode to be formed later and has a charge holding (charge accumulation) function. Therefore, it has a laminated structure having at least three layers, in which the potential barrier height of the inner layer (silicon nitride film C2) is smaller than the potential barrier height of the outer layers (silicon oxide films C1 and C3). The thickness of each layer has an optimum value for each operation type of the nonvolatile memory cell.

Then, a silicon film SI2 as a conductive film is formed over the insulating film CSL. The thickness of the silicon film SI2 is, for example, 20 nm to 100 nm or so. The silicon film SI2 may be, for example, a polycrystalline silicon film formed by the CVD technique, etc. Alternatively, the silicon film SI2 may be formed by depositing an amorphous silicon film and crystallizing it by heat treatment (crystallization). Impurities may be implanted into the silicon film SI2 as necessary. The silicon film SI2 is to become the memory gate electrode (for example, with a gate length of about 50 nm) of the memory cell MC in the memory cell region 1A as stated later.

Figure 6:
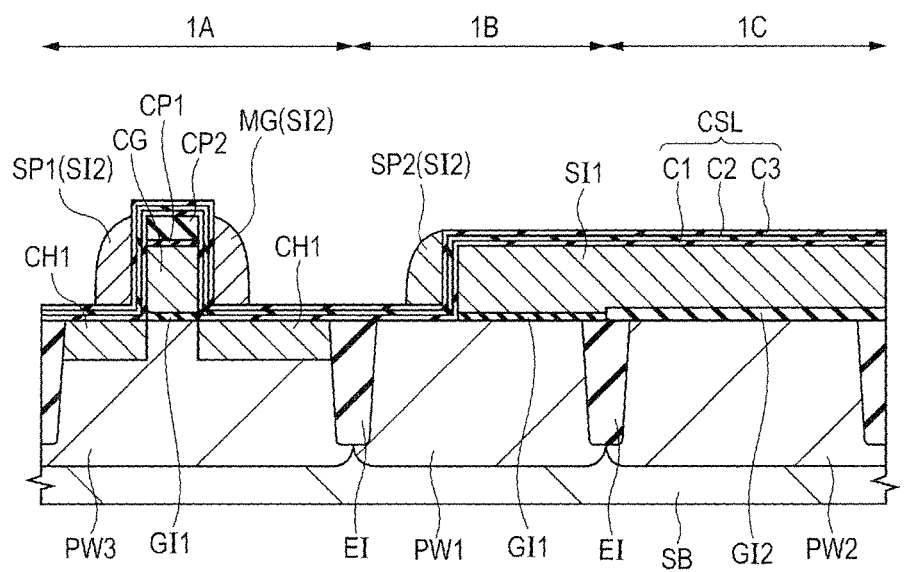
FIG. 6 is a sectional view of a step next to the step shown in FIG. 5 in the semiconductor device manufacturing process.

Next, as shown in FIG. 6, the silicon film SI2 is etched back. In this etch-back step, the silicon film SI2 is removed by a prescribed thickness amount from its surface by anisotropic dry etching. As a result of carrying out this step, the silicon film SI2 remains in the form of side walls (sidewall films) on the sidewall parts on both sides of the control gate electrode CG through the insulating film CSL. At this time, in the low-voltage MIS region 1B and high-voltage MIS region 1C, the silicon film SI2 is etched and thus the insulating film CSL is exposed. At the ends of the low-voltage MIS region 1B and high-voltage MIS region 1C, the silicon film SI2 remains as a silicon spacer SP2 on the sidewall of the silicon film SI1 through the insulating film CSL, in the form of a side wall (sidewall film).

A memory gate electrode MG is formed from the silicon film SI2 remaining on one of both the sidewall parts of the control gate electrode CG. A silicon spacer SP1 is formed from the silicon film SI2 remaining on the other sidewall part.

In the memory cell region 1A, the insulating film CSL under the memory gate electrode MG serves as the gate insulating film of the memory transistor. The gate length of the memory gate electrode MG is determined depending on the thickness of the silicon film SI2.

As mentioned above, the memory gate electrode MG is formed on the sidewall of the control gate electrode area (film lamination of the control gate electrode CG and cap insulating films) through the insulating film CSL, in the form of a side wall (sidewall film). Therefore, by making the control gate electrode area high enough, the memory gate electrode MG can be formed into an adequate shape in a highly controllable manner. In addition, since the memory gate electrode MG can have an adequate height, the side wall SW on the sidewall of the memory gate electrode MG can be formed into an adequate shape in a highly controllable manner. Furthermore, an extension region EX2 and a diffusion layer DL2 to be formed by implanting n-type impurities using the memory gate electrode MG and the side wall SW as a mask can be shaped adequately in a highly controllable manner.

The insulating film CSL lies between the memory gate electrode MG and the main surface of the semiconductor substrate SB, and the insulating film CSL extends continuously from between the memory gate electrode MG and the main surface of the semiconductor substrate SB along the area between the memory gate electrode MG and the sidewall of the control gate electrode CG. In short, the insulating film CSL has an L-shaped sectional structure.

Figure 7:
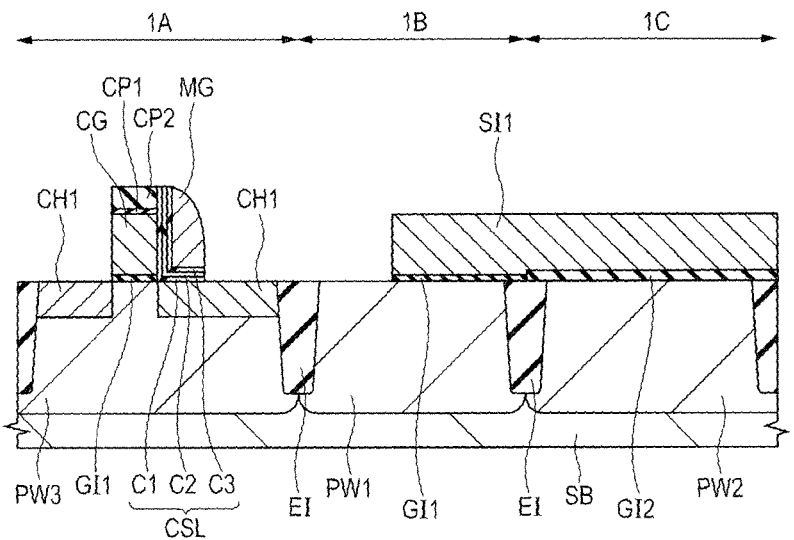
FIG. 7 is a sectional view of a step next to the step shown in FIG. 6 in the semiconductor device manufacturing process.

Next, the silicon spacer SP1 on the sidewall of the control gate electrode CG where the memory gate electrode MG is not formed, and the silicon spacer SP2 adjacent to the silicon film SI1 through the insulating film CSL are removed by etching, as shown in FIG. 7.

Then, the insulating film exposed from the memory gate electrode MG is removed by etching. Consequently, the silicon film SI1 is exposed in the low-voltage MIS region 1B and high-voltage MIS region 1C. In addition, in the memory cell region 1A, the silicon nitride film CP2 on the top of the control gate electrode CG is exposed and the p-type well PW3 with a channel region CH1 formed in the upper surface is exposed.

Next, in the low-voltage MIS region 1B and high-voltage MIS region 1C, n-type impurities such as P (phosphorous) are implanted into the silicon film SI1.

Figure 8:
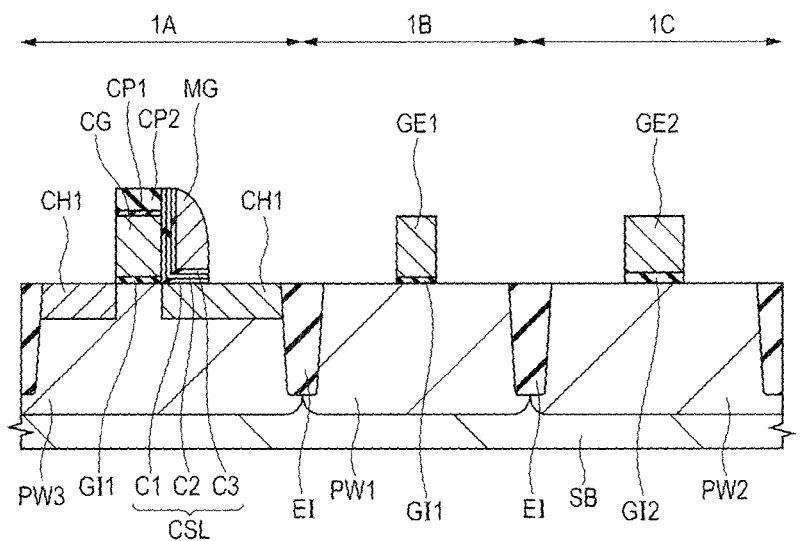
FIG. 8 is a sectional view of a step next to the step shown in FIG. 7 in the semiconductor device manufacturing process.

Next, referring to FIG. 8, a photoresist film (not shown) is formed over the silicon film SI1 by the photolithographic technique in areas where the gate electrodes of a low-voltage MIS transistor and a high-voltage MIS transistor are to be formed, and using the photoresist film as a mask, the silicon film SI1 and the insulating films GI1 and GI2 are etched. Then, the photoresist film is removed by asking, etc. so that a gate electrode GE1 is formed for the low-voltage MIS transistor in the low-voltage MIS region 1B and agate electrode GE2 is formed for the high-voltage MIS transistor in the high-voltage MIS region 1C.

The gate length of the gate electrode GE1 is, for example, about 40 nm and the gate length of the gate electrode GE2 is, for example, about 1000 nm.

The insulating film GI1 remaining under the gate electrode GE1 serves as the gate insulating film of the low-voltage MIS transistor and the insulating film GI2 remaining under the gate electrode GE2 serves as the gate insulating film of the high-voltage MIS transistor.

Figure 9:
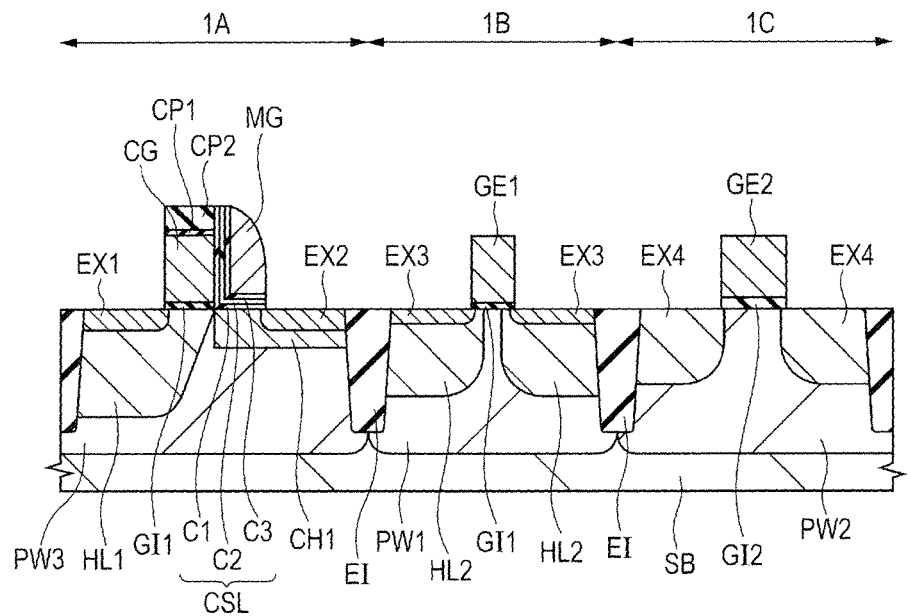
FIG. 9 is a sectional view of a step next to the step shown in FIG. 8 in the semiconductor device manufacturing process.

Next, referring to FIG. 9, a photoresist film (not shown) is formed, in which it has an opening to expose the main surface of the semiconductor substrate SB in an area adjacent to the sidewall of the control gate electrode CG (on the opposite side of the memory gate electrode MG). The photoresist film is a resist pattern which covers the main surface portion of the semiconductor substrate SB adjacent to the memory gate electrode MG, the low-voltage MIS region 1B, and the high-voltage MIS region 1C. After that, p-type impurities are obliquely implanted into the main surface of the semiconductor substrate SB using the photoresist film pattern as a mask.

Consequently, a halo region (p-type impurity region) HL1 is formed in the semiconductor substrate SB under the control gate electrode CG. The halo region HL1 suppresses the spread of a depletion layer from the drain region to be formed later, toward the channel region of the memory transistor and thereby suppresses the short channeling effect of the memory transistor. This suppresses the decrease in the threshold voltage of the memory transistor.

Furthermore, with the presence of the photoresist film, n-type impurities such as As (arsenic) or P (phosphorous) are implanted into the semiconductor substrate SB to form an extension region EX1 as an n$^-$-type semiconductor region. The extension region EX1 is formed in the main surface of the semiconductor substrate SB by self-alignment with the sidewall of the control gate electrode CG (sidewall opposite to the sidewall adjacent to the memory gate electrode MG through the insulating film CSL). After that, the photoresist film is removed.

Then, a photoresist film (not shown) is formed, in which it has an opening to expose the main surface of the semiconductor substrate SB in an area adjacent to the memory gate electrode MG. The photoresist film is a resist pattern which covers the main surface portion of the semiconductor substrate SB adjacent to the control gate electrode CG, the low-voltage MIS region 1B, and the high-voltage MIS region 1C. After that, using the photoresist film pattern as a mask, n-type impurities such as As (arsenic) or P (phosphorous) are implanted into the upper surface of the semiconductor substrate SB (p-type well PW3) to form an extension region EX2 as an n⁻-type semiconductor region. Here, the extension region EX2 is formed by self-alignment with the sidewall of the memory gate electrode MG (sidewall opposite to the sidewall adjacent to the control gate electrode CG through the insulating film CSL).

In forming the extension region EX2, ion implantation is performed with a higher ion concentration than in the ion implantation step of forming the extension region EX1. In other words, then-type impurity concentration of the extension region EX2 is higher than the n-type impurity concentration of the extension region EX1. The extension region EX1 and the extension region EX2 are almost the same in terms of formation depth. It has been mentioned above that the extension regions EX1 and EX2 are formed in different steps. However, the extension regions EX1 and EX2 may be formed in the same ion implantation step.

Then, a photoresist film is formed to expose the main surface of the semiconductor substrate SB in the low-voltage MIS region 1B and cover the memory cell region 1A and high-voltage MIS region 1C. After that, using the photoresist film pattern as a mask, p-type impurities are obliquely implanted into the main surface of the semiconductor substrate SB. Consequently, a p-type halo region (p-type impurity region) HL2 is formed in the semiconductor substrate SB beside the gate electrode GE1.

Then, using the photoresist film as a mask, n-type impurities such as As (arsenic) or P (phosphorous) are implanted into the upper surface of the semiconductor substrate SB (p-type well PW1) to form an extension region EX3 as an n⁻-type semiconductor region. The extension region EX3 is formed in the main surface of the semiconductor substrate SB on both sides of the gate electrode GE1. Here, the extension region EX3 is formed by self-alignment with the sidewall of the gate electrode GE1.

The extension region EX3 is shallower in formation depth than the extension regions EX1 and EX2. Since the extension region EX3 is shallow, the low-voltage MIS transistor including the extension region EX3 can operate at higher speed. The extension region EX3 is covered by the halo region HL2 in the semiconductor substrate SB.

Then, a photoresist film (not shown) is formed to cover the memory cell region 1A and low-voltage MIS region 1B and expose the high-voltage MIS region 1C. After that, using the photoresist film as a mask, n-type impurities such as As (arsenic) or P (phosphorous) are implanted into the upper surface of the semiconductor substrate SB (p-type well PW2) to form an extension region EX4 as an n⁻-type semiconductor region. The extension region EX4 is formed in the main surface of the semiconductor substrate SB on both sides of the gate electrode GE2. Here, the extension region EX4 is formed by self-alignment with the sidewall of the gate electrode GE2.

The extension region EX4 has a larger formation depth than any of the extension regions EX1 to EX3. Since the extension region EX4 has a large depth, it is possible to prevent the possibility that the n-type impurities contained in the extension region EX4 spread widely during the heat treatment which will be described referring to FIG. 14 and the impurity concentration difference between the n-type semiconductor region of the source/drain region of the high-voltage MIS transistor and the p-type well PW2 becomes considerable. Therefore, the breakdown voltage of the high-voltage MIS transistor can be increased. The halo region HL2 has a larger formation depth than any of the extension regions EX1 to EX4.

Here, the extension regions EX1, EX2, and EX3 are formed in different ion implantation steps. Since the extension regions EX1 to EX3 are thus formed in different ion implantation steps, each of the extension regions EX1 to EX3 can be formed with the desired impurity concentration and the desired junction depth. In other words, the concentration distribution of the extension regions and the source/drain regions to be formed later can be set more freely than when two or more types of extension regions among the extension regions EX1 to EX3 are formed in an ion implantation step.

The extension region EX1 may be formed before the halo region HL1 is formed. Also, the extension region EX3 may be formed before the halo region HL2 is formed. The formation of the halo region HL1 and extension region EX1, the formation of the extension region EX2, and the formation of the halo region HL2 and extension region EX3 maybe carried out in any sequence.

The extension region EX1 is formed inside the halo region HL1. Specifically, the halo region HL1 is deeper than the extension region EX1 and the end of the extension region EX1 on the memory gate electrode MG side is covered by the halo region HL1. Part of the halo region HL1 overlaps the entire channel region CH1 on the control gate electrode CG side. In the memory cell region 1A, the extension region EX1, halo region HL1, p-type well PW3, channel region CH1, and extension region EX2 are arranged on the main surface of the semiconductor substrate SB in the order of mention in the direction from the extension region EX1 to the extension region EX2.

Figure 10:
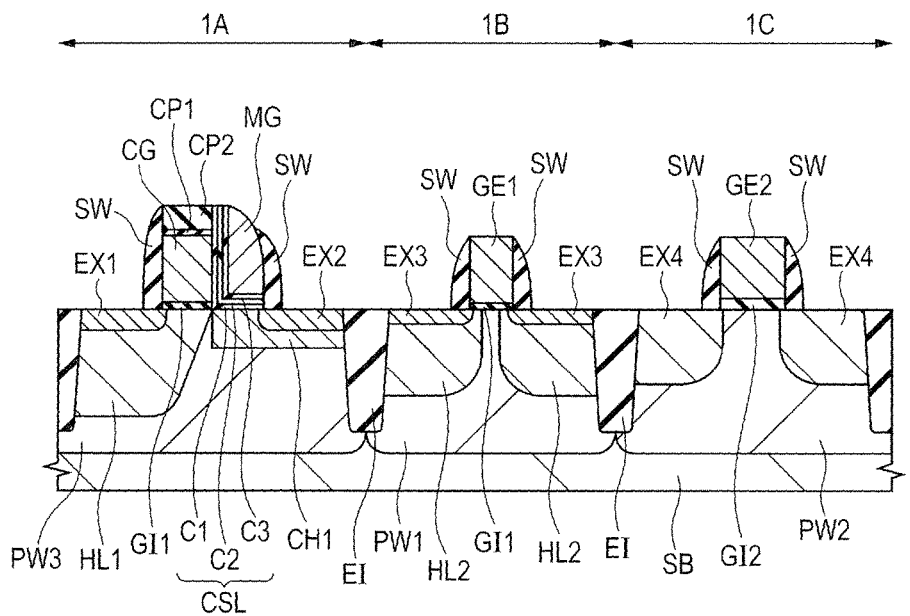
FIG. 10 is a sectional view of a step next to the step shown in FIG. 9 in the semiconductor device manufacturing process.

Next, as shown in FIG. 10, in the memory cell region 1A, side walls SW as sidewall insulating films are formed on the sidewall parts on both sides of the combination pattern of the control gate electrode CG and memory gate electrode MG. Also, in the low-voltage MIS region 1B and high-voltage MIS region 1C, side walls SW are formed on the sidewall parts on both sides of each of the gate electrodes GE1 and GE2. In the procedure of forming a side wall, an insulating film as a laminate including a silicon oxide film and a silicon nitride film is formed, for example, by depositing a silicon oxide film over the entire main surface of the semiconductor substrate SB and depositing a silicon nitride film over it.

The main surface of the semiconductor substrate SB and the upper surfaces of the control gate electrode CG, memory gate electrode MG, and gate electrodes GE1 and GE2 are exposed by etching the insulating film. Side walls SW are thus formed on the sidewall parts of the combination pattern, the sidewall parts of the gate electrode GE1, and the sidewall parts of the gate electrode GE2. The side wall SW may be a laminate including a silicon oxide film and a silicon nitride film or may be an insulating film as a single-layer silicon oxide film or a single-layer silicon nitride film.

Figure 11:
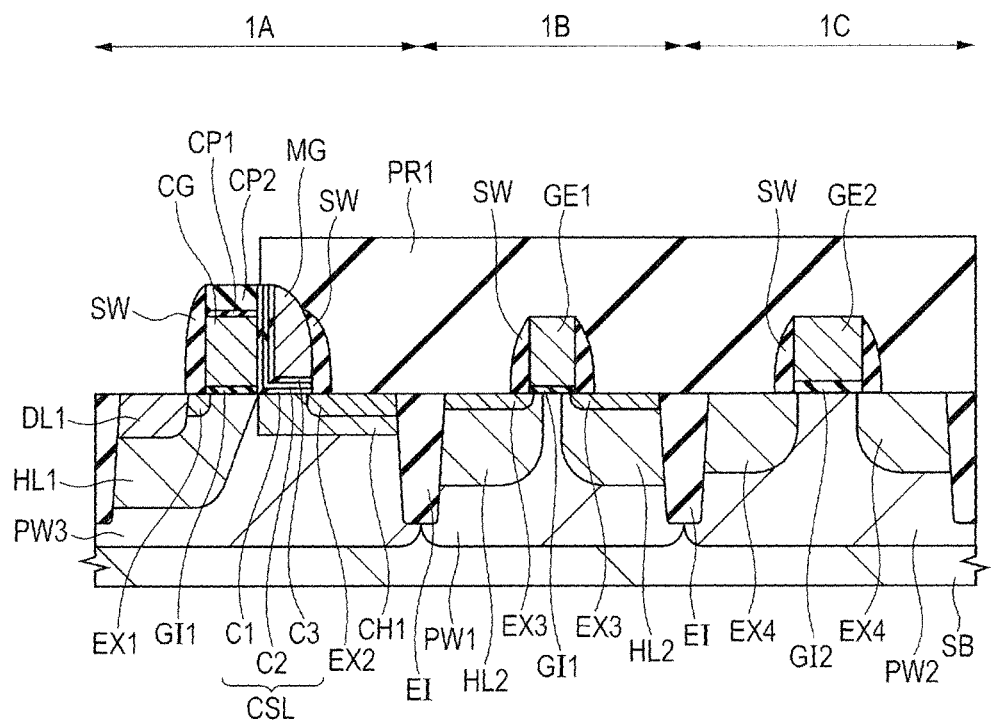
FIG. 11 is a sectional view of a step next to the step shown in FIG. 10 in the semiconductor device manufacturing process.

Next, as shown in FIG. 11, a photoresist film PR1 is formed to cover part of the memory cell region 1A and entirely cover the main surface of the semiconductor substrate SB in the low-voltage MIS region 1B and high-voltage MIS region 1C. In the memory cell region 1A, the photoresist film PR1 covers the main surface of the semiconductor substrate SB at least in an area adjacent to the memory gate electrode MG. The photoresist film PR1 also covers the upper surface of the memory gate electrode MG. The photoresist film PR1 exposes the main surface of the semiconductor substrate SB in an area adjacent to the control gate electrode CG and exposes the upper surface of the silicon nitride film CP2.

Then, using the photoresist film PR1, silicon nitride film CP2, and sidewalls SW as a mask, n-type impurities such as As (arsenic) or P (phosphorous) are implanted into the upper surface of the semiconductor substrate SB (p-type well PW3) on the control gate electrode CG side in the memory cell region 1A. A diffusion layer DL1 as an n$^+$-type semiconductor region with a high impurity concentration is thus formed in the main surface of the semiconductor substrate SB on the control gate electrode CG side in the memory cell region 1A. Here, the diffusion layer DL1 is formed by self-alignment with the side wall SW on the control gate electrode CG side.

The n-type impurity concentration of the diffusion layer DL1 is higher than that of the extension region EX1 and its junction depth (formation depth) is larger. In the ion implantation step of forming the diffusion layer DL1, the formation depth of the diffusion layer DL1 is decreased by using a relatively low level of implantation energy. In this ion implantation step, since the main surface of the semiconductor substrate SB on the memory gate electrode MG side is covered by the photoresist film PR1, no diffusion layer is formed in the semiconductor substrate SB on the memory gate electrode MG side.

Figure 12:
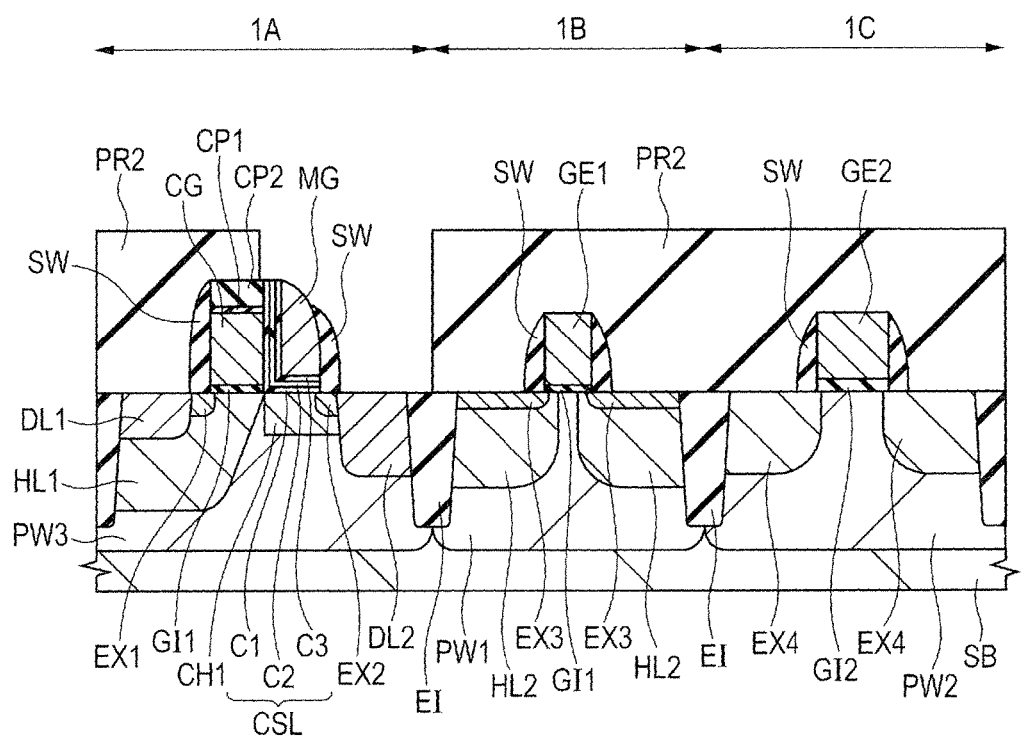
FIG. 12 is a sectional view of a step next to the step shown in FIG. 11 in the semiconductor device manufacturing process.

Next, as shown in FIG. 12, after the photoresist film PR1 is removed, a photoresist film PR2 is formed to cover part of the memory cell region 1A and entirely cover the main surface of the semiconductor substrate SB in the low-voltage MIS region 1B and high-voltage MIS region 1C. In the memory cell region 1A, the photoresist film PR2 covers the main surface of the semiconductor substrate SB at least in an area adjacent to the control gate electrode CG. The photoresist film PR2 also covers the upper surface of the silicon nitride film CP2. The photoresist film PR2 exposes the main surface of the semiconductor substrate SB in an area adjacent to the memory gate electrode MG and exposes the upper surface of the memory gate electrode MG.

Then, using the photoresist film PR2, memory gate electrode MG, and sidewalls SW as a mask, n-type impurities such as As (arsenic) or P (phosphorous) are implanted into the upper surface of the semiconductor substrate SB (p-type well PW3) on the memory gate electrode MG side in the memory cell region 1A. A diffusion layer DL2 as an n$^+$-type semiconductor region with a high impurity concentration is thus formed in the main surface of the semiconductor substrate SB on the memory gate electrode MG side in the memory cell region 1A. Here, the diffusion layer DL2 is formed by self-alignment with the side wall SW on the memory gate electrode MG side.

The n-type impurity concentration of the diffusion layer DL2 is higher than that of the extension regions EX1 and EX2 and its junction depth (formation depth) is larger. In the ion implantation step of forming the diffusion layer DL2, the formation depth of the diffusion layer DL2 is made larger than the formation depth of the diffusion layer DL1 by using a relatively high level of implantation energy. In this ion implantation step, since the main surface of the semiconductor substrate SB on the control gate electrode CG side is covered by the photoresist film PR2, n-type impurities are not implanted into it.

The formation depth of the diffusion layer DL2 is larger than that of the channel region CH1. The end of the extension region EX1 is nearer to the channel region underneath the control gate electrode CG than to the diffusion layer DL1 and the end of the extension region EX2 is nearer to the channel region underneath the memory gate electrode MG than to the diffusion layer DL2. Here, the diffusion layers DL1 and DL2 are assumed to have almost the same impurity concentration. However, the diffusion layers DL1 and DL2 may have different impurity concentrations. For example, the impurity concentration of the diffusion layer DL2 may be higher than that of the diffusion layer DL1.

Figure 13:
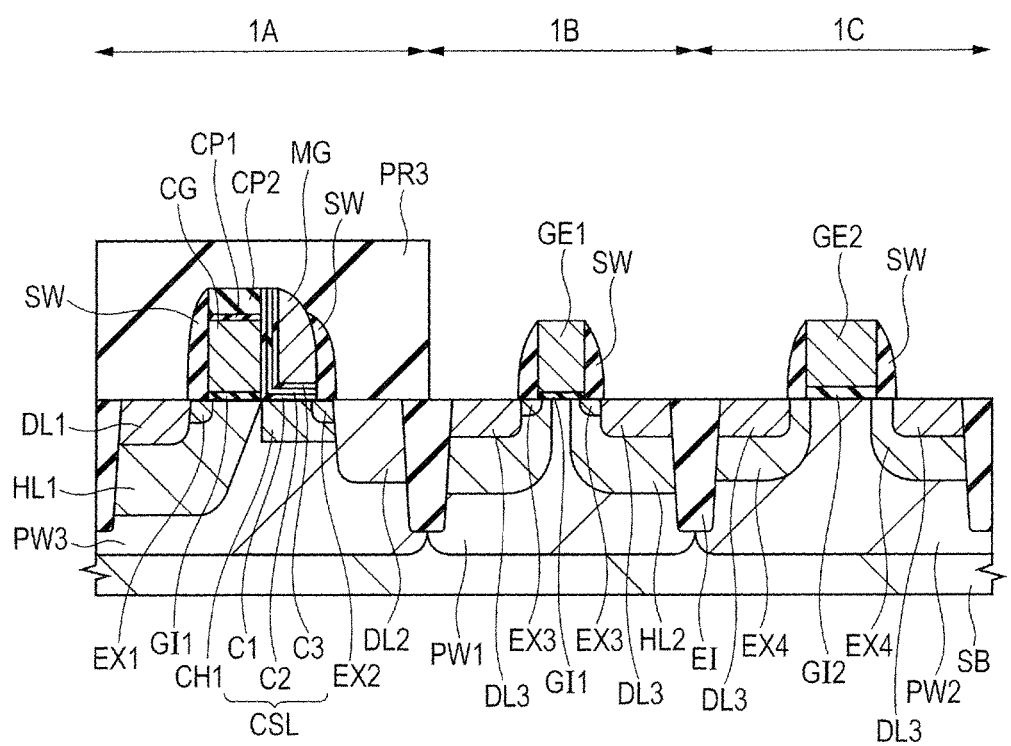
FIG. 13 is a sectional view of a step next to the step shown in FIG. 12 in the semiconductor device manufacturing process.

As shown in FIG. 13, after the photoresist film PR2 is removed, a photoresist film PR3 is formed to entirely cover the main surface of the semiconductor substrate SB in the memory cell region 1A and entirely expose the main surface of the semiconductor substrate SB in the low-voltage MIS region 1B and high-voltage MIS region 1C.

Then, using the photoresist film PR3, gate electrodes GE1 and GE2, and sidewalls SW as a mask, n-type impurities such as As (arsenic) or P (phosphorous) are implanted into the upper surface of the semiconductor substrate SB (p-type wells PW1, PW2) in the low-voltage MIS region 1B and high-voltage MIS region 1C. A diffusion layer DL3 as an n$^+$-type semiconductor region with a high impurity concentration is thus formed in the main surface of the semiconductor substrate SB in the low-voltage MIS region 1B and high-voltage MIS region 1C. Here, the diffusion layer DL3 is formed by self-alignment with the side wall SW. The n-type impurity concentration of the diffusion layer DL3 is higher than that of the extension regions EX3 and EX4.

The formation depth of the diffusion layer DL3 is larger than that of the extension region EX3 and smaller than that of the extension region EX4 and diffusion layer DL2. At this time, since the main surface of the semiconductor substrate SB in the memory cell region 1A is covered by the photoresist film PR3, n-type impurities are not implanted into it. The diffusion layers DL1, DL2, and DL3 may be formed in any sequence.

The impurity concentration of the diffusion layer DL3 is higher than that of the diffusion layers DL1 and DL2. Consequently, the low-voltage MIS transistor to be formed later can operate at higher speed than the control transistor which will be described later, because the resistance of its source/drain region can be decreased. In addition, since the diffusion layer DL3 has a high impurity concentration, the breakdown voltage of the high-voltage MIS transistor can be increased by diffusion of n-type impurities in the diffusion layer DL3. Since the concentration of the diffusion layer DL1 is lower than that of the diffusion layer DL3, the n-type impurities in the diffusion layer DL1 are prevented from spreading widely in the semiconductor substrate SB. This prevents the decrease in the threshold voltage of the control transistor to be formed later.

Figure 14:
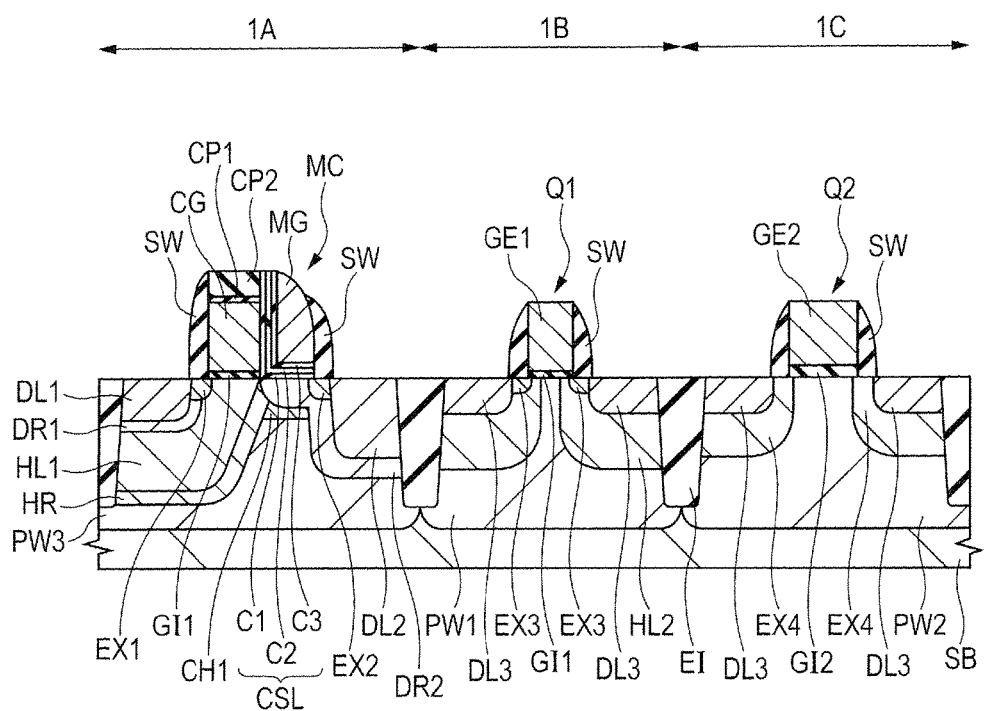
FIG. 14 is a sectional view of a step next to the step shown in FIG. 13 in the semiconductor device manufacturing process.

Next, referring to FIG. 14, after the photoresist film PR3 is removed, heat treatment (activation) is carried out on the semiconductor substrate SB in order to diffuse the impurities implanted into the semiconductor substrate SB and activate the various semiconductor regions. Consequently, the n-type impurities are diffused from the extension region EX1 and diffusion layer DL1 in the semiconductor substrate SB, resulting in the formation of a diffusion region DR1 as an n-type semiconductor region. In addition, the heat treatment diffuses the n-type impurities from the extension region EX2 and diffusion layer DL2 in the semiconductor substrate SB, resulting in the formation of a diffusion region DR2 as an n-type semiconductor region. The heat treatment also diffuses the p-type impurities from the halo region HL1 in the semiconductor substrate SB, resulting in the formation of a diffusion region HR as a p-type semiconductor region.

The diffusion region DR1 has a lower impurity concentration than the diffusion layer DL1 and extension region EX1. The diffusion region DR2 has a lower impurity concentration than the diffusion layer DL2 and extension region EX2. The diffusion region HR has a lower impurity concentration than the halo region HL1.

The diffusion region DR2 is joined to the channel region CH1 of the memory cell region 1A so that the diffusion region DR2 extends to the channel region side underneath the control gate electrode CG in the main surface of the semiconductor substrate SB as shown in FIG. 14. The halo region HL1 and the diffusion region DR2 are adjacent to each other and the diffusion region HR and the diffusion region DR2 abut on each other.

Even by the above heat treatment, n-type impurities are hardly diffused from the diffusion region DL1 since its impurity concentration is lower than that of the diffusion layer DL2. The diffusion region DR1 shown in the figure indicates the range of diffusion of the n-type impurities from the diffusion layer DL1. Therefore, in some cases, even if the extension region EX1 overlaps the control gate electrode CG in a plan view, the diffusion region DR1 does not overlap the control gate electrode CG. The end of the extension region EX1 on the diffusion layer DL2 side is not covered by the diffusion region DR1. Specifically, the end of the extension region EX1 on the diffusion layer DL2 side is nearer to the diffusion layer DL2 than to the diffusion region DR1. In other words, in the main surface of the semiconductor substrate SB, the end of the diffusion region DR1 on the diffusion layer DL2 side is nearer to the diffusion layer DL1 than the end of the extension region EX1 on the diffusion layer DL2 side.

When heat treatment is performed, impurities in a semiconductor region with a larger depth diffuse more extensively than impurities in a semiconductor region with a smaller depth. Therefore, the difference in formation depth between the diffusion region DR2 and the diffusion layer DL2 is larger than the difference in formation depth between the diffusion region DR1 and the diffusion layer DL1. In other words, in the direction perpendicular to the upper surface of the semiconductor substrate SB, the distance from the bottom of the diffusion layer DL2 to the bottom of the diffusion region DR2 is larger than the distance from the bottom of the diffusion layer DL1 to the bottom of the diffusion region DR1 and thus the diffusion region DR2 extends more deeply and more widely than the diffusion region DR1.

Here, in the semiconductor substrate SB, the extension region EX2 is covered by the diffusion region DR2 and the diffusion layer DL2. Specifically, the end of the extension region EX2 on the diffusion layer DL1 side is covered by the diffusion region DR2. In other words, in the main surface of the semiconductor substrate SB, the end of the diffusion region DR2 on the diffusion layer DL1 side is nearer to the diffusion layer DL1 than the end of the extension region EX2 on the diffusion layer DL1 side.

In the low-voltage MIS region 1B and high-voltage MIS region 1C as well, impurities diffuse from the extension region EX3 and the diffusion layer DL3, etc. into the semiconductor substrate SB, though not illustrated here. The formation depth of the diffusion region (not shown) containing the n-type impurities diffused from the diffusion layer DL3 is smaller than that of the diffusion region DR2.

In the memory cell region 1A, the extension region EX1, diffusion layer DL1, and diffusion region DR1 constitute an n-type drain region which functions as the drain region of the memory transistor. Also, in the memory cell region 1A, the extension region EX2, diffusion layer DL2, and diffusion region DR2 constitute an n-type source region which functions as the source region of the memory transistor. Also, in the low-voltage MIS region 1B and high-voltage MIS region 1C, the extension region EX3 and diffusion layer DL3 constitute a source/drain region.

Each source region and each drain region have an LDD (Lightly Doped Drain) structure which includes a diffusion layer with a high n-type impurity concentration and an extension region with a low n-type impurity concentration which is adjacent to the diffusion layer in the main surface of the semiconductor substrate SB.

The source region, drain region, and control gate electrode CG in the memory cell region 1A constitute a control transistor as an n-channel field effect transistor. Furthermore, the source region, drain region, and memory gate electrode MG in the memory cell region 1A constitute a memory transistor as an n-channel field effect transistor. This means that the control transistor and the memory transistor share the source and drain regions. The control transistor and memory transistor, which are adjacent to each other, constitute a MONOS memory cell MC. The control transistor is an enhancement-type transistor and the memory transistor is a depletion-type transistor.

The source/drain regions and the gate electrode GE1 in the low-voltage MIS region 1B constitute a low-voltage MISQ1 and the source/drain regions and the gate electrode GE2 constitute a high-voltage MISQ2. The low-voltage MISQ1 is a transistor which operates at lower voltage than the high-voltage MISQ2 and is a semiconductor element which can operate at higher speed than the high-voltage MISQ2, control transistor and memory transistor. The high-voltage MISQ2 is a transistor which operates at higher voltage than the control transistor.

Figure 15:
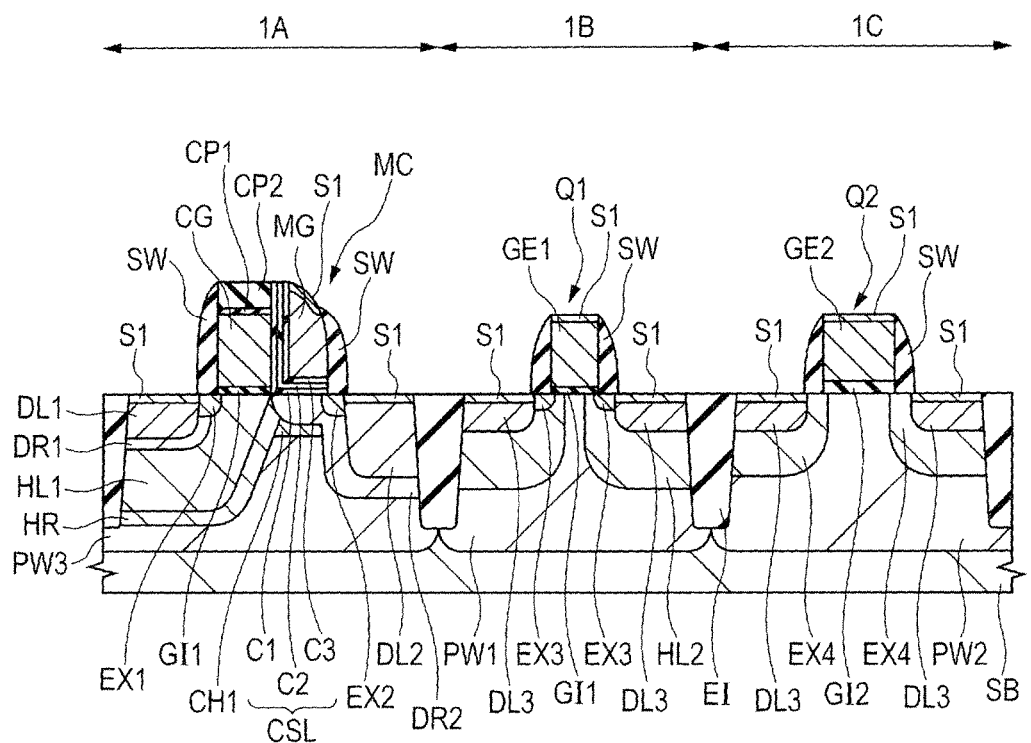
FIG. 15 is a sectional view of a step next to the step shown in FIG. 14 in the semiconductor device manufacturing process.

Next, as shown in FIG. 15, a silicide layer S1 is formed over each of the memory gate electrode MG, gate electrodes GE1 and GE2, and diffusion layers DL1 to DL3 using the salicide (self-aligned silicide) technique. The silicide layer S1 can decrease the diffusion resistance and contact resistance. The silicide layer S1 is formed in accordance with the following procedure.

For example, a metal film (not shown) is formed over the entire main surface of the semiconductor substrate SB and heat treatment is performed on the semiconductor substrate SB so that the upper layers of the memory gate electrode MG, gate electrodes GE1 and GE2 and diffusion layers DL1 to DL3 react with the metal film. The silicide layer S1 is thus formed over each of the memory gate electrode MG, gate electrodes GE1 and GE2, and diffusion layers DL1 to DL3. The metal film is, for example, a cobalt (Co) or nickel (Ni) film which can be formed by sputtering, etc. After that, the unreacted metal film portion is removed.

Figure 16:
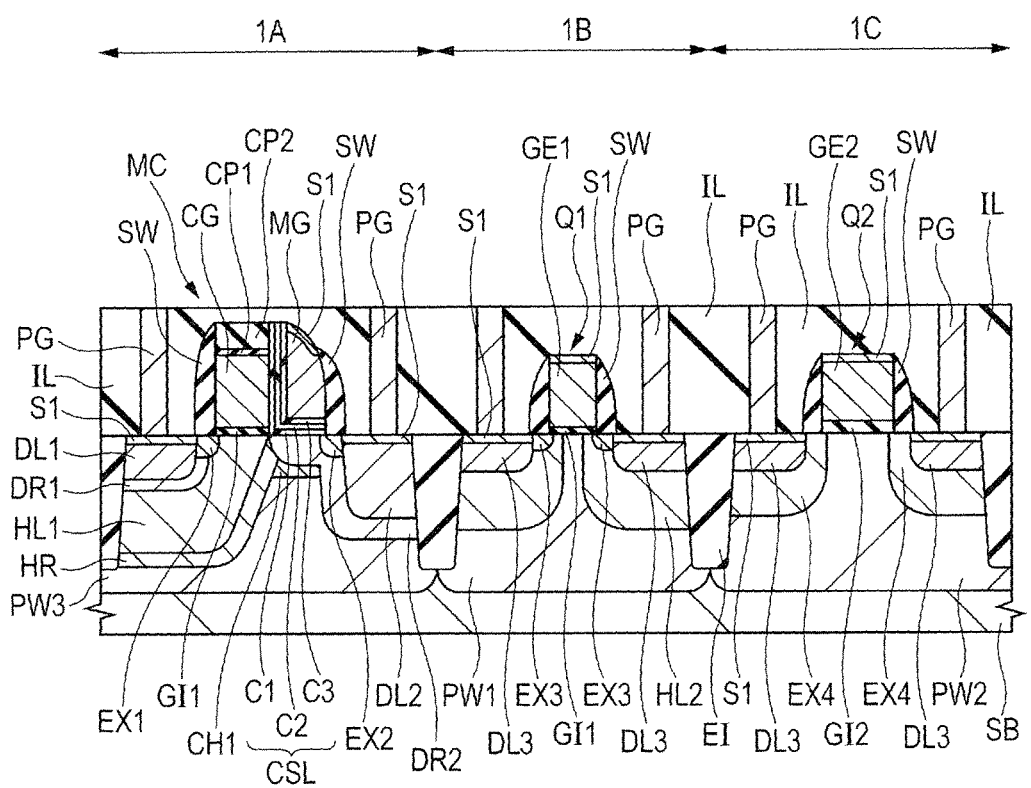
FIG. 16 is a sectional view of a step next to the step shown in FIG. 15 in the semiconductor device manufacturing process.

Next, as shown in FIG. 16, an interlayer insulating film IL is formed over the entire main surface of the semiconductor substrate SB to cover the memory cell MC, low-voltage MISQ1 transistor, and high-voltage MISQ2 transistor. The interlayer insulating film IL is a single silicon oxide film or a laminated film including a silicon nitride film and a silicon oxide film. After the interlayer insulating film IL is formed, for example, by the CVD technique, the upper surface of the interlayer insulating film is planarized.

Then, plugs PG which penetrate the interlayer insulating film IL are formed as follows. First, a photoresist film (not shown) is formed by the photolithographic technique, and using the photoresist film as a mask, the interlayer insulating film IL is etched to make a plurality of contact holes in the interlayer insulating film IL. Then, a conductive plug PG of tungsten (W), etc. is formed in each contact hole.

In order to form plugs PG, a barrier conductor film such as a titanium (Ti) film, titanium nitride (TiN) film or a laminated film of these is formed over the interlayer insulating film IL including the inside of each of the contact holes. Then, a main conductor film such as a tungsten (W)

film is formed over the barrier conductor film so as to fill each contact hole and the unrequired portions of the main conductor film and barrier conductor film are removed by the CMP (Chemical Mechanical Polishing) technique or etch-back technique. The plugs PG are thus formed. For illustration simplicity, the barrier conductor film and main conductor film which constitute the plugs PG are shown in an integrated form.

In the memory cell region 1A, low-voltage MIS region 1B, and high-voltage MIS region 1C, the contact holes and the plugs PG buried in them are coupled to the upper surfaces of the diffusion layers DL1 to DL3 through the silicide layers S1. In the regions not shown, the plugs PG are coupled to the upper surfaces of the control gate electrode CG, memory gate electrode MG, and gate electrodes GE1 and GE2 through the silicide layers S1.

Figure 17:
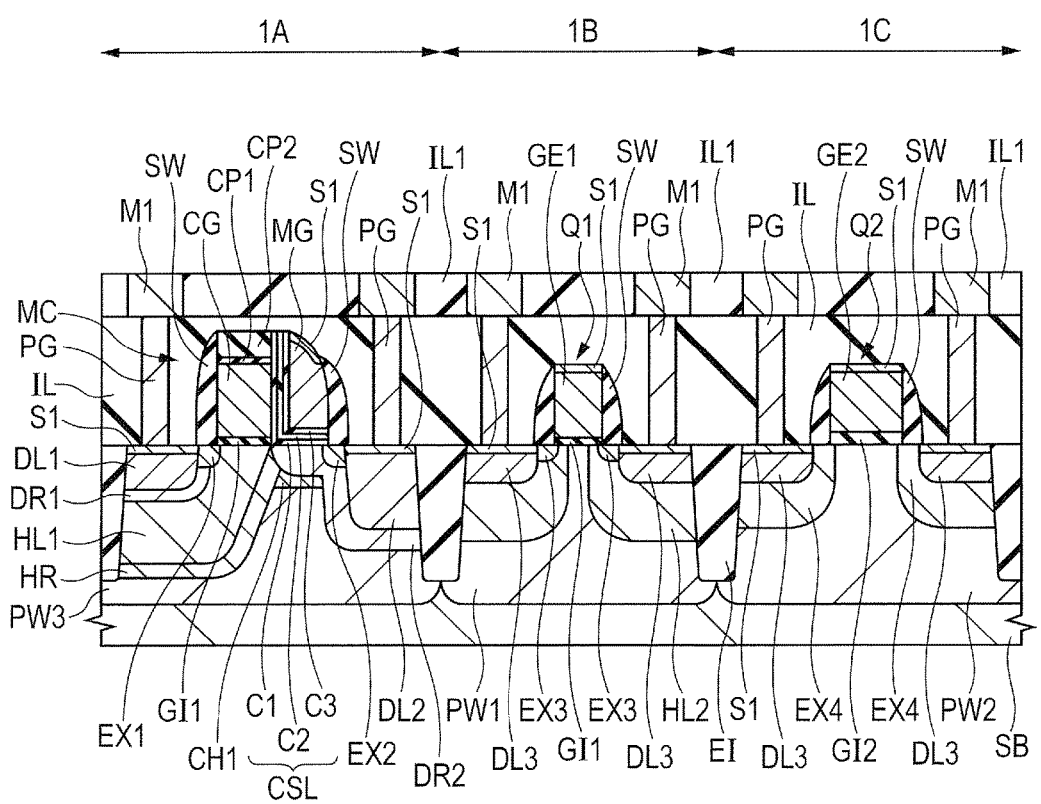
FIG. 17 is a sectional view of a step next to the step shown in FIG. 16 in the semiconductor device manufacturing process.

Then, as shown in FIG. 17, after an interlayer insulating film IL1 such as a silicon oxide film is formed over the interlayer insulating film IL, a plurality of wiring grooves which penetrate the interlayer insulating film IL1 are formed by the photolithographic technique and dry etching technique. After that, a conductive film is deposited and buried in each wiring groove and the conductive film lying over the interlayer insulating film IL1 is removed. Consequently, a plurality of wirings M1 which are made of the conductive film and electrically coupled to the plugs PG are formed. The wirings M1 are mainly made of copper (Cu).

By taking the above steps, the semiconductor device according to this embodiment is almost finished. Specifically, a low-voltage MISQ1 transistor, a high-voltage MISQ2 transistor, and a memory cell MC as a nonvolatile memory cell are formed in the low-voltage MIS region 1B, high-voltage MIS region 1C, and memory cell region A, respectively.

<Operation of the Semiconductor Device>

Next, an example of operation of the nonvolatile memory will be described. The operation of the memory cell MC as a nonvolatile memory cell includes writing, erasing, and reading. In this example, the SSI (Source Side Injection) method is adopted for writing and erasing. In this embodiment, injection of electrons into the silicon nitride film C2 as a charge accumulation area in the insulating film CSL as an ONO film is defined as "writing" and extraction of electrons from it is defined as "erasing".

A plurality of memory cells MC are arranged in an array pattern over the semiconductor substrate SB and writing, erasing, and reading operations are performed only on the desired memory cells MC among these memory cells MC. This means that writing, erasing, and reading operations are usually not performed on the non-selected memory cells or cells other than the selected memory cells.

In the memory cell array, a non-selected memory cell arranged in the same row as a selected memory cell is coupled to the same memory gate line as the selected memory cell. Also, in the memory cell array, a non-selected memory cell arranged in the same column as a selected memory cell is coupled to the same word line (control gate line) as the selected memory cell. This means that the same voltage is applied to the memory gate electrodes MG of the memory cells arranged in the same row and the same voltage is applied to the control gate electrodes CG of the memory cells arranged in the same column.

In writing operation, the following voltages are applied to the various parts of a memory cell MC to operate for writing, namely a selected memory cell. For example, referring to FIG. 17, 0 V is applied to the semiconductor substrate SB, 6 V is applied to the source region including the diffusion layer DL2, 0.5 V is applied to the drain region including the diffusion layer DL1, 1 V is applied to the control gate electrode CG, and 12 V is applied to the memory gate electrode MG. Consequently, electrons move from the drain region to the source region. At this time, since the electric field on the surface of the semiconductor substrate SB between the control gate electrode CG and memory gate electrode MG is intensified, hot carriers are generated, thereby causing the electrons to move from inside the semiconductor substrate SB through the silicon oxide film C1 and be injected into the silicon nitride film C2. Writing is thus performed.

The electrons are trapped at the trap level in the silicon nitride film C2 and as a consequence, the threshold voltage of the transistor of the memory cell MC rises. That is, the memory cell MC enters the writing state.

In the non-selected memory cell which is not supposed to operate for writing, 0 V is applied to the semiconductor substrate SB, 6 V is applied to the source region including the diffusion layer DL2, 1.5 V is applied to the drain region including the diffusion layer DL1, 1 V is applied to the control gate electrode CG, and 12 V is applied to the memory gate electrode MG. In this case, the voltage applied to the drain region is higher than in the selected memory cell, so that a current does not flow between the source and drain regions. For this reason, writing is not performed.

For erasing, the erasing method in which erasing is performed by injection of hot holes according to the so-called BTBT (Band-To-Band Tunneling) method (hot hole injection erase) is adopted. In the BTBT method, erasing is performed by injecting the holes (positive holes) generated by BTBT into the charge accumulation area (silicon nitride film C2).

In erasing operation, the following voltages are applied to the various parts of the selected memory cell to operate for erasing. For example, referring to FIG. 17, 0 V is applied to the semiconductor substrate SB, 6 V is applied to the source region including the diffusion layer DL2, 1.5 V is applied to the drain region including the diffusion layer DL1, 0 V is applied to the control gate electrode CG, and −6 V is applied to the memory gate electrode MG. Consequently, holes are generated in the semiconductor substrate SB through a BTBT phenomenon and holes are injected into the silicon nitride film C2 of the selected memory cell by electric field acceleration, thereby decreasing the threshold voltage of the transistor of the memory cell MC. Thus the memory cell MC enters the erased state.

In reading operation, the voltage applied to the control gate electrode CG is between the transistor threshold voltage in the writing state and its threshold voltage in the erased state so that the writing state and the erased state can be distinguished from each other. In this example, 0 V is applied to the semiconductor substrate SB, the memory gate electrode MG, and the source region and 1.5 V is applied to the drain region and the control gate electrode CG. In the writing state, in which charge is accumulated in the silicon nitride film C2, the threshold voltage is high and thus the transistor does not turn on. On the other hand, in the erased state, in which charge is extracted from the silicon nitride film C2, the threshold voltage is low and thus the transistor turns on. Since the transistor operates differently in this way, data can be read from the memory cell MC.

<Effects of the First Embodiment>

Figure 28:
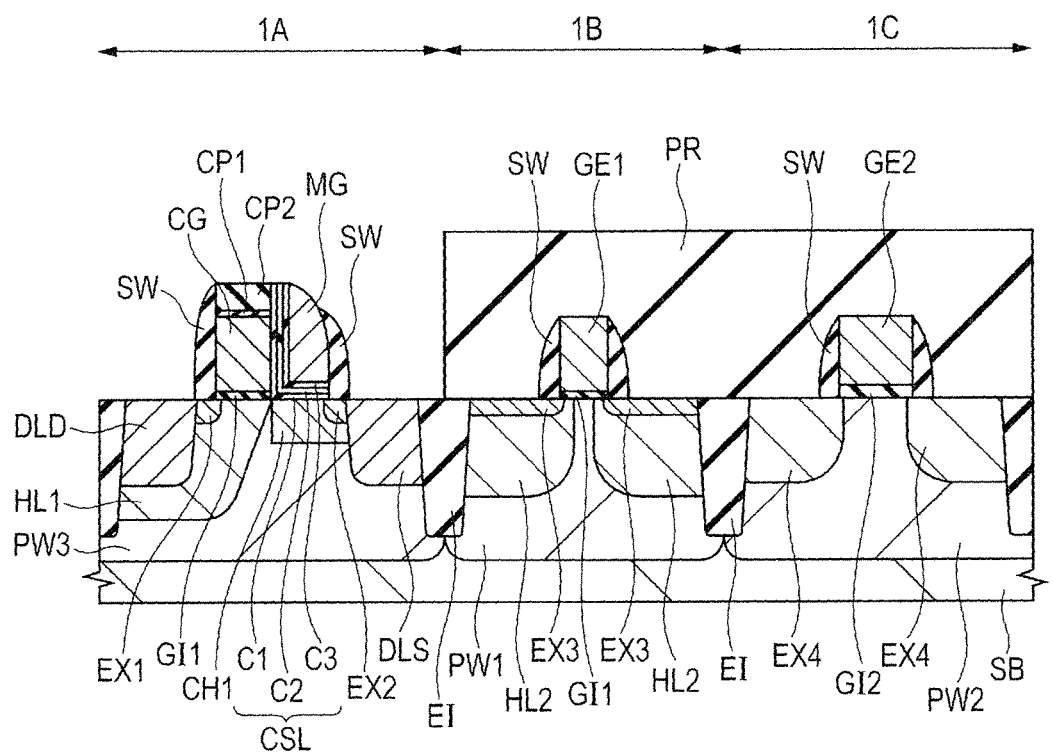
FIG. 28 is a sectional view of a step in a semiconductor device manufacturing process in Comparative Example 1.
Figure 29:
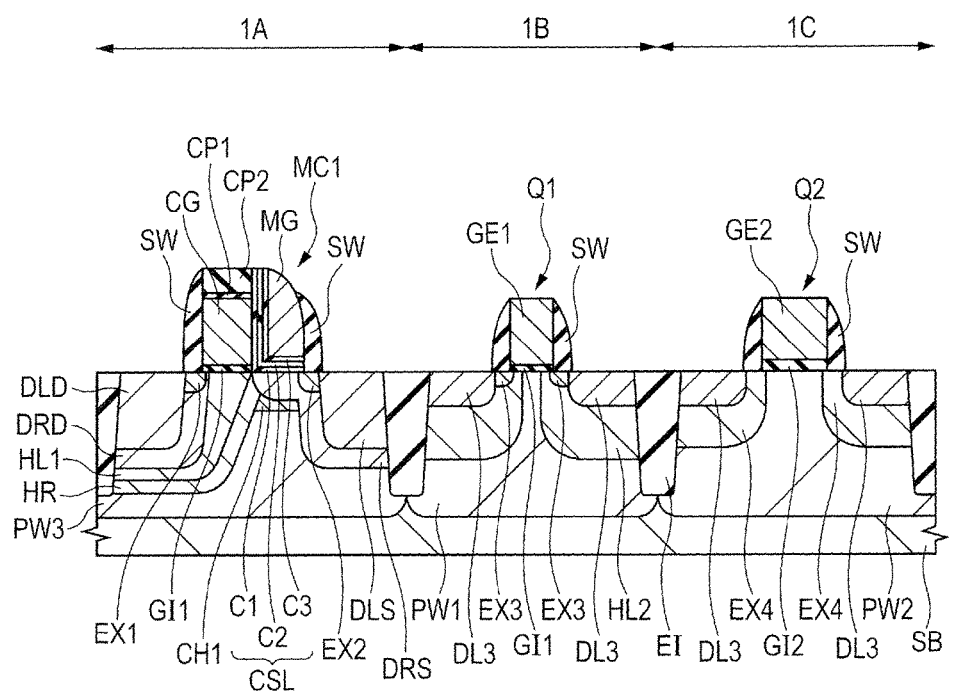
FIG. 29 is a sectional view of a step next to the step shown in FIG. 28 in the semiconductor device manufacturing process.
Figure 30:
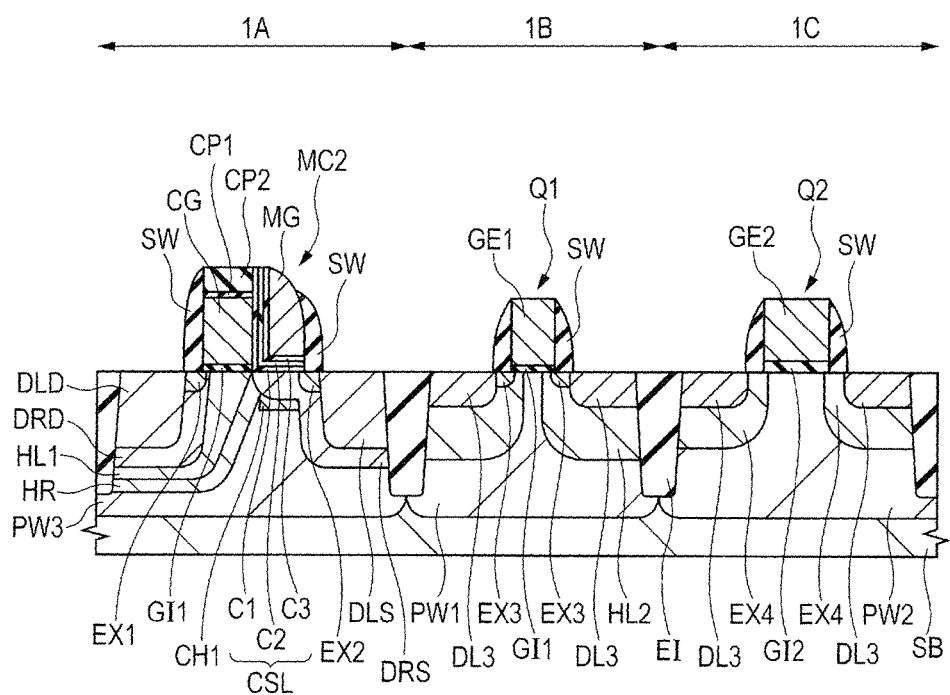
FIG. 30 is a sectional view of a step in a semiconductor device manufacturing process in Comparative Example 2.

Next, a method of manufacturing a semiconductor device as a comparative example will be described referring to FIGS. 28 to 30 and the effects of this embodiment will be explained. FIG. 30 is a sectional view of a step in the semiconductor device manufacturing process in Comparative Example 2 in which the control gate electrode gate length is relatively large and FIGS. 28 and 29 are sectional views of steps in the semiconductor device manufacturing process in Comparative Example 1 in which the control gate electrode gate length is smaller than in the structure shown in FIG. 30. FIGS. 28 to 30 show the memory cell region 1A, low-voltage MIS region 1B, and high-voltage MIS region 1C in the same way as FIGS. 1 to 17.

In the semiconductor device manufacturing process in Comparative Example 1, first the same steps as the steps described above referring to FIGS. 1 to 10 are carried out. However, the p-type impurity concentration of the halo region HL1 formed here is higher than that of the halo region HL1 (see FIG. 9) formed in the semiconductor device manufacturing process according to the first embodiment.

Then, as shown in FIG. 28, a photoresist film PR is formed to cover the main surface of the semiconductor substrate SB in the low-voltage MIS region 1B and high-voltage MIS region 1C and expose the memory cell region 1A. Then, using the silicon nitride film CP2, memory gate electrode MG, sidewalls SW and photoresist film PR as a mask, n-type impurity ions (such as P (phosphorous) or As (arsenic)) are implanted into the main surface of the semiconductor substrate SB to form diffusion layers DLD and DLS which have a higher impurity concentration than the extension regions EX1 to EX4.

The diffusion layer DLD is formed in the main surface of the semiconductor substrate SB on the control gate electrode CG side and the diffusion layer DLS is formed in the main surface of the semiconductor substrate SB on the memory gate electrode MG side. The diffusion layers DLD and DLS are n-type semiconductor regions which are larger in formation depth than the extension regions EX1 to EX4 and smaller in formation depth than the halo region HL1. Since the diffusion layers DLD and DLS are formed in the same implantation step as mentioned above, they have virtually the same formation depth. The formation depth of the diffusion layers DLD and DLS is, for example, the same as that of the diffusion layer DL2 shown in FIG. 17.

Next, a diffusion layer DL3 (see FIG. 29) is formed in each of the low-voltage MIS region 1B and high-voltage MIS region 1C by taking the same step as the step described above referring to FIG. 13.

Next, referring to FIG. 29, the impurities in the semiconductor substrate SB are diffused and heat treatment is performed to activate the semiconductor regions in the semiconductor substrate SB. Consequently, the n-type impurities contained in the diffusion layers DLD and DLS diffuse into the semiconductor substrate SB so that a diffusion region DRD containing the n-type impurities spread around the diffusion layer DLD and a diffusion region DRS containing the n-type impurities spread around the diffusion layer DLS are formed. For example, the diffusion region DRS has the same structure as the diffusion region DR2 shown in FIG. 14. The diffusion region DRD has the same formation depth as the diffusion region DRS and covers the end of the extension region EX1 on the extension region EX2 side.

By taking the above steps, a drain region including the diffusion region DRD, diffusion layer DLD, and extension region EX1 and a source region including the diffusion region DRS, diffusion layer DLS, and extension region EX2 are formed and a memory cell MC1, which includes the drain region, the source region and a control gate electrode CG and a memory gate electrode MG, is formed.

The subsequent steps are the same as the steps described above referring to FIGS. 15 to 17 and the semiconductor device in Comparative Example 1 is almost finished by taking those steps.

As shown in FIG. 29, the memory cell in Comparative Example 1 is different from that in the first embodiment in that the diffusion layer DLD of the drain region has the same depth as the diffusion layer DLS of the source region and the diffusion region DRD has the same depth as the diffusion region DRS.

Next, the semiconductor device manufacturing process in Comparative Example 2 will be described. FIG. 30 is a sectional view of a manufacturing step after the heat treatment step described above referring to FIG. 29. The semiconductor device manufacturing process in Comparative Example 2 is almost the same as the above semiconductor device manufacturing process in Comparative Example 1. In the semiconductor device manufacturing process in Comparative Example 2, the diffusion layers DLD and DLS are formed simultaneously in the same injection step. However, as shown in FIG. 30, in the memory cell MC2 in Comparative Example 2, the gate length of the control gate electrode CG of the memory cell MC2 is larger than that of the memory cell MC1 (see FIG. 29) in Comparative Example 1. In addition, in the memory cell MC2 in Comparative Example 2, the p-type impurity concentrations of the halo region HL1 and the diffusion region HR are lower than those in the memory cell MC1 (see FIG. 29) in Comparative Example 1.

In the case of a MONOS memory cell, when the semiconductor device is miniaturized, there arises a problem that due to worsening of the short channel characteristics, the threshold voltage (Vth) of the transistor of the memory cell decreases and it is difficult to control the memory cell. In this case, the formation of a halo region with the conductivity type opposite to the conductivity type of the drain region between the drain region and channel region prevents worsening of the short channel characteristics and the decrease in the threshold voltage of the transistor.

In Comparative Example 2 shown in FIG. 30, since the gate length of the control gate electrode CG is large, even if the diffusion region DRD of the drain region spreads as widely as the diffusion region DRS of the source region, the channel region between the source and drain regions can have a sufficient width. In other words, the effective gate length and the channel length cannot be too short. Therefore, it is unnecessary to increase the p-type impurity concentrations of the halo region HL1 and diffusion region HR in order to prevent worsening of the short channel characteristics.

Furthermore, since the gate length of the control gate electrode CG is large, even if a portion of the diffusion region HR abuts on the source region, the p-type impurity concentration of the diffusion region HR's portion abutting on the source region is low. This means that the difference in n-type impurity concentration between the halo region HL1 and diffusion region HR and the source region cannot be serious and generation of junction leakage current is thus prevented.

In contrast, when the semiconductor device is more miniaturized and the gate length of the control gate electrode CG is small as in Comparative Example 1 shown in FIG. 29, the channel region distance between the diffusion region DRD of the drain region and the diffusion region DRS of the source region is shorter, making it impossible to ensure a sufficient effective gate length. Consequently, the problem of worsening of the short channel characteristics arises. The reason for this problem is that the diffusion layer DLD of the drain region and the diffusion layer DLS of the source region are formed in the same implantation step (see FIG. 28), so that they have the same depth and the same concentration.

Specifically, since a high voltage is applied to the source region in rewriting operation of the memory cell MC1, the n-type impurities of the source region must be gradually diffused around the source region in order to improve the breakdown voltage of the source region. This prevents the impurity concentration difference between the p-type well PW3 as a p-type semiconductor region and the source region as an n-type semiconductor region from becoming serious, so that the depletion layer easily spreads from the source region and the breakdown voltage of the memory cell MC1 is improved.

One method of diffusing the n-type impurities of the source region gradually between the source region and the p-type well region PW3 is to make the diffusion layer DLS of the source region have a large depth. In Comparative Example 1, by forming the diffusion layer DLS with a larger depth than the diffusion layer DL3 in the low-voltage MIS region 1B or high-voltage MIS region 1C (see FIG. 29), the n-type impurities in the diffusion layer DLS are diffused widely and gradually by heat treatment to form the diffusion region DRS. As shown in FIGS. 17 and 29, the source region extends so as to partially overlap the memory gate electrode MG in a plan view.

In Comparative Example 1, since the source region and drain region are formed with the same depth and the same concentration in the same step, the n-type impurities of the drain region also diffuse widely in the same way. Consequently, the diffusion region DRD of the drain region largely overlaps the channel region underneath the control gate electrode CG. In this case, since the drain region extends widely and the distance between the source and drain regions is short, the effective gate length and channel length are short. This worsens the short channel characteristics and decreases the threshold voltage of the control transistor.

One possible method of increasing the threshold voltage of the control transistor is to increase the concentration of the halo region HL1 as a p-type semiconductor region which covers the drain region and spreads toward the source region side in the semiconductor substrate SB or increase the p-type impurity concentration of the channel region.

However, if the p-type impurity concentration of the halo region HL1 is increased, the concentration difference in the PN junction between the halo region HL1 and the source region is larger, thereby increasing the risk of miswriting in a non-selected memory cell in writing operation of the memory cell MC. Specifically, when the concentration difference in the PN junction between the halo region HL1 and the source region is larger, carriers are generated in the PN junction near the border between the control gate electrode CG and the memory gate electrode MG and a junction leakage current flows in the source region. Some of the carriers generated here are, as hot carriers, drawn toward the high voltage of the memory gate electrode MG and passed through the silicon oxide film (bottom oxide film) C1 of the insulating film CSL as an ONO film and introduced into the silicon nitride film (charge accumulation layer) C2 of the ONO film. Miswriting in a non-selected memory cell occurs in this way.

In short, in a split-gate MONOS memory cell, short channel characteristics and miswriting are in the trade-off relation. This problem can arise if the p-type impurity concentration of the channel region or p-type well PW3 is increased in order to increase the threshold voltage of the control transistor. Furthermore, if the size of the control gate electrode CG or memory gate electrode MG is decreased for miniaturization of the semiconductor element, the above problem is more serious due to worsening of the short channel characteristics.

For reading, the control transistor of the memory cell MC1 is required to operate at high speed, but when the drain region has a large formation depth like the source region as in Comparative Example 1 and Comparative Example 2, it is difficult that the control transistor operates at high speed.

For this reason, in this embodiment, the diffusion layer DL1 of the drain region of the memory cell MC (see FIG. 14) and the diffusion layer DL2 of its source region are formed under different conditions in different ion implantation steps, as described above referring to FIGS. 11 and 12. Therefore, it is possible to form the diffusion layer DL2 with a large depth and form the diffusion layer DL1 with a smaller depth than the diffusion layer DL2.

Since the diffusion layer DL2 has a large depth, the n-type impurity concentration of the diffusion region DR2 formed by heat treatment as shown in FIG. 14 gradually decreases in the direction from the diffusion layer DL2 to the p-type well PW3. This prevents the concentration difference between p-type impurities and n-type impurities in the PN junction between the channel region and p-type well PW3 and the source region from becoming seriously large, thereby increasing the breakdown voltage of the source region.

Here, since the formation depth of the diffusion layer DL1 of the drain region is small, the concentration difference between p-type impurities and n-type impurities in the PN junction between the channel region and p-type well PW3 and the drain region is larger than the concentration difference in the PN junction between the source region and p-type well. However, the voltage applied to the drain region is not so high as the voltage applied to the source region and the problem of decrease in breakdown voltage does not occur.

Also, in the drain region, the formation depths of the diffusion layer DL1 and diffusion region DR1 can be decreased so that high speed operation of the control transistor is easy.

Suppression of the spread of the diffusion region DR1 prevents part of the drain region from largely overlapping the control gate electrode CG in a plan view. In this embodiment, the diffusion region DR1 does not overlap the control gate electrode CG in a plan view. In other words, in one memory cell, the diffusion layer DL1 and diffusion region DR1 are spaced from the control gate electrode CG in a plan view. This ensures that the width of the channel region between the drain region and source region is sufficient, thereby preventing the effective gate length from becoming small. Therefore, even if the gate length of the control gate electrode CG is decreased for miniaturization of the semiconductor element, worsening of the short channel characteristics is prevented.

In addition, since the short channel characteristics do not worsen as mentioned above, the p-type impurity concentrations of the halo region HL1 and diffusion region HR need not be increased excessively. Therefore, the concentration and formation depth of the halo region HL1 can be suppressed. Therefore, the p-type impurity concentrations of the halo region HL1 and diffusion region HR in the vicinity of the source region can be decreased. This prevents the concentration difference in the PN junction between the halo region HL1 and diffusion region HR and the source region from increasing and also prevents the concentration difference from becoming seriously large.

This prevents generation of junction leakage current in a non-selected memory cell in writing operation of the memory cell MC. In short, miswriting attributable to generation of hot carriers between the halo region HL1 and diffusion region HR and the source region in a non-selected memory cell is prevented.

As described above, in this embodiment, the diffusion layer DL1 of the drain region and the diffusion layer DL2 of the source region are formed in different steps and the source/drain region is asymmetrical in shape. This prevents miswriting in the memory cell and makes it possible to miniaturize the memory cell MC and increase its breakdown voltage and enables high speed operation, thereby leading to improvement in the performance of the semiconductor device.

<Variation>

Figure 18:
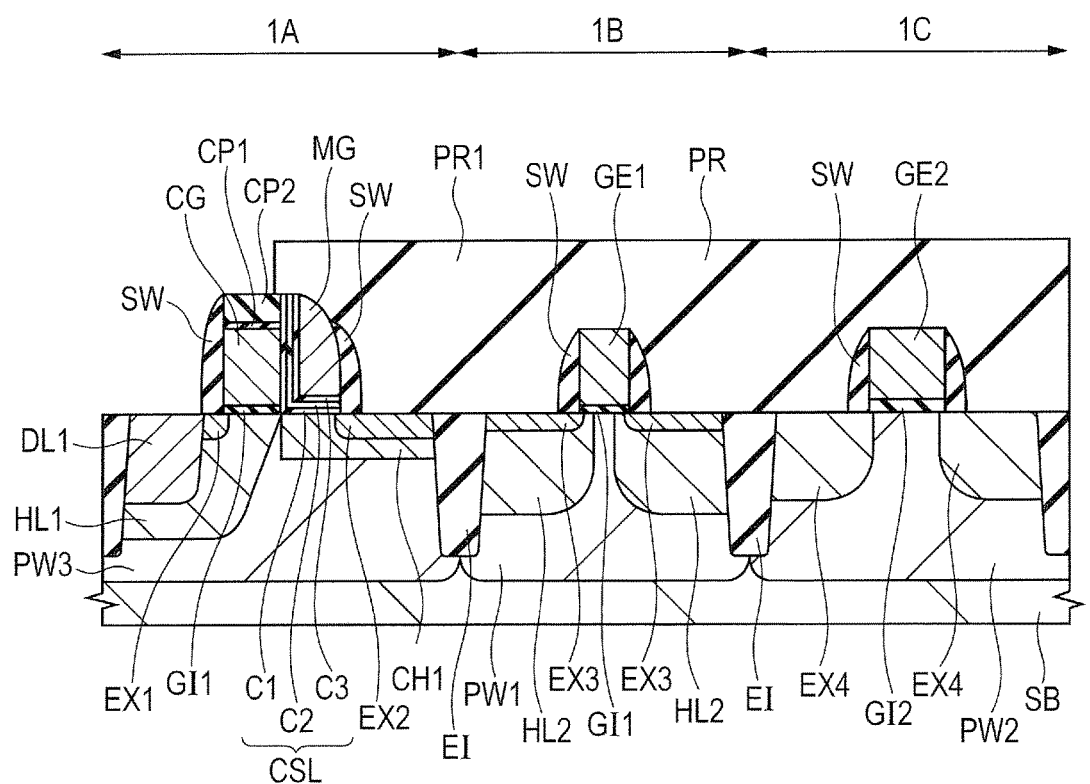
FIG. 18 is a sectional view of a step in a variation of the method of manufacturing a semiconductor device according to the first embodiment.
Figure 19:
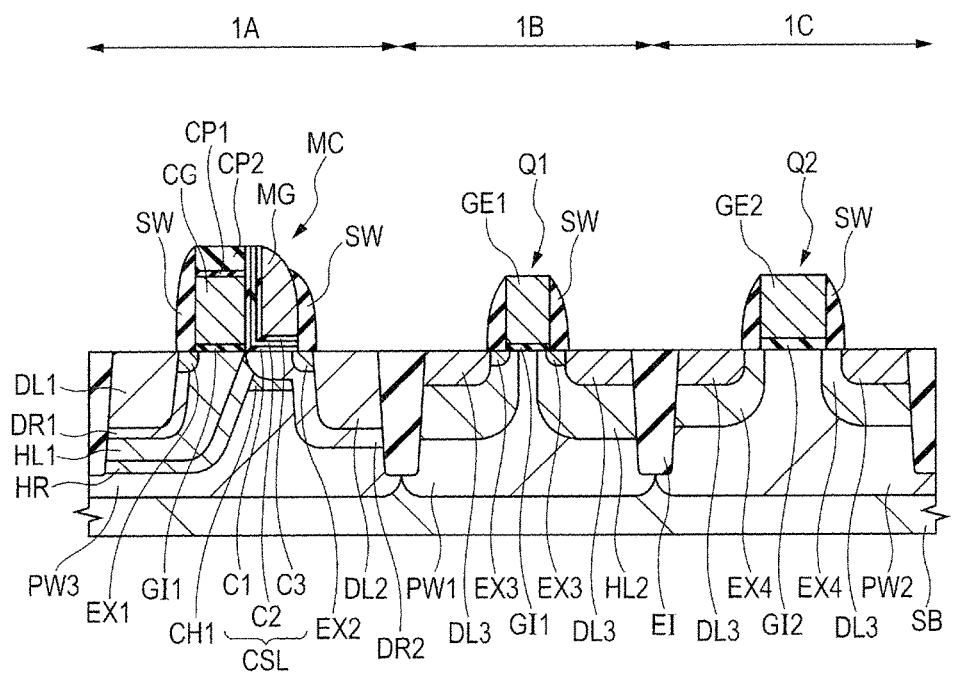
FIG. 19 is a sectional view of a step next to the step shown in FIG. 18 in the semiconductor device manufacturing process.

Next, the semiconductor device manufacturing process as a variation of the first embodiment will be described referring to FIGS. 18 and 19. FIGS. 18 and 19 are sectional views of steps in the semiconductor device manufacturing process as a variation of the first embodiment. This variation is the same as the first embodiment described above referring to FIGS. 1 to 17 in that the diffusion layers of the source and drain regions of the memory cell are formed in different steps. This variation is different from the process described above referring to FIGS. 1 to 17 in that the diffusion layers of the source and drain regions are the same in depth and different in concentration.

In the semiconductor device manufacturing process in this variation, first the same steps as the steps described above referring to FIGS. 1 to 10 are carried out, and then using the photoresist film PR1, silicon nitride film CP2, and sidewalls SW as a mask, n-type impurities are implanted into the main surface of the semiconductor substrate SB on the control gate electrode CG side with a relatively low concentration to form a diffusion layer DL1, as shown in FIG. 18. In this variation, the impurity concentration of the diffusion layer DL1 is lower than that of the diffusion layer DL1 described referring to FIG. 11 and the diffusion layer DLD described referring to FIG. 28.

Next, by taking the same step as the step described referring to FIG. 12, ion implantation is performed with a relatively high impurity concentration to form a diffusion layer DL2 (see FIG. 19).

Here, the ion implantation steps of forming the diffusion layers DL1 and DL2 are carried out under almost the same energy condition, so that the diffusion layers DL1 and DL2 have almost the same formation depth. However, the diffusion layer DL2 has a higher n-type impurity concentration than the diffusion layer DL1. In this variation, the impurity concentration of the diffusion layer DL2 is lower than that of the diffusion layer DL2 described referring to FIG. 12.

Next, by taking the same step as the step described referring to FIG. 13, a diffusion layer DL3 is formed in the low-voltage MIS region 1B and the high-voltage MIS region 1C.

Next, as shown in FIG. 19, the n-type impurities in the diffusion layers DL1 to DL3 are diffused by performing heat treatment as in the step described referring to FIG. 14. Consequently, a diffusion region DR1 is formed around the diffusion layer DL1 and a diffusion region DR2 is formed around the diffusion layer DL2. Here, the formation depth of the diffusion region DR1 is smaller than the formation depth of the diffusion region DR2. In short, the extent of spread of the diffusion region DR1 is smaller than that of the diffusion region DR2. This is because the impurity concentration of the diffusion layer DL1 is lower than that of the diffusion layer DL2.

After that, the semiconductor device in this variation is almost finished by taking the same steps as the steps described referring to FIGS. 15 to 17.

In this variation, the spread of the diffusion region DR1 is suppressed by decreasing the impurity concentration of the diffusion layer DL1. Specifically, the difference in formation depth between the diffusion region DR2 and the diffusion layer DL2 is larger than the difference in formation depth between the diffusion region DR1 and the diffusion layer DL1. In other words, in the direction perpendicular to the upper surface of the semiconductor substrate SB, the distance from the bottom of the diffusion layer DL2 to the bottom of the diffusion region DR2 is larger than the distance from the bottom of the diffusion layer DL1 to the bottom of the diffusion region DR1. This prevents the channel length between the drain region and source region from being small. Therefore, it is unnecessary to increase the p-type impurity concentrations of the halo region HL1 and diffusion region HR. Therefore, this variation brings about the same advantageous effects as the method of manufacturing a semiconductor device described referring to FIGS. 1 to 17.

This variation may be combined with the first embodiment described referring to FIGS. 1 to 17. Specifically, the diffusion layer DL1 may have a lower concentration and a smaller formation depth and the diffusion layer DL2 may have a higher concentration and a larger formation depth.

Second Embodiment

Figure 20:
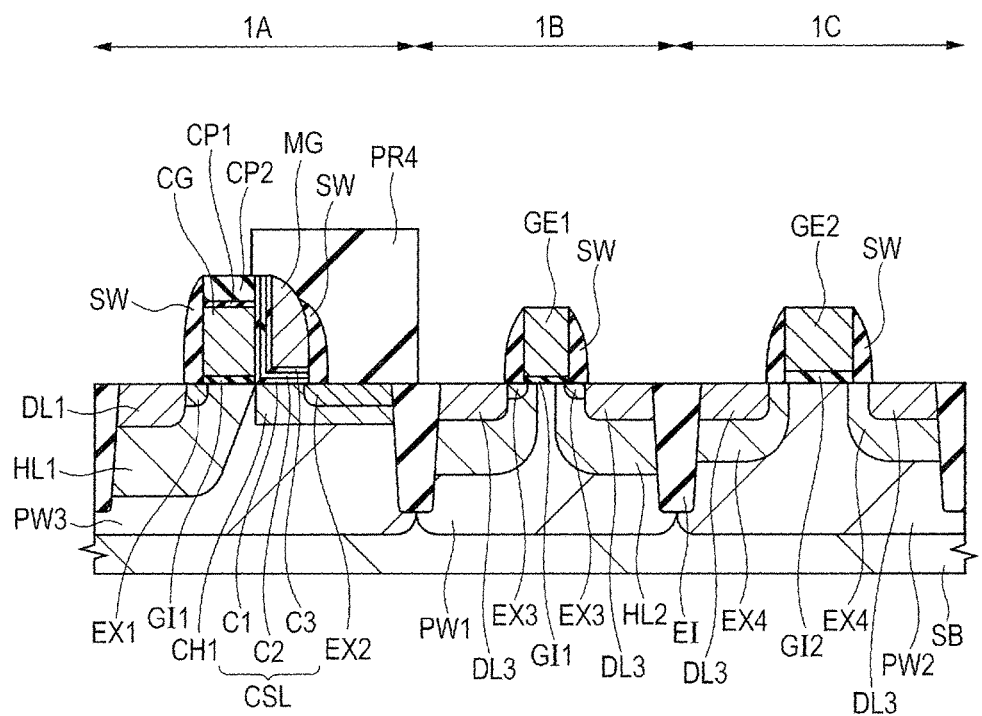
FIG. 20 is a sectional view of a step in a semiconductor device manufacturing process according to a second embodiment of the present invention.
Figure 21:
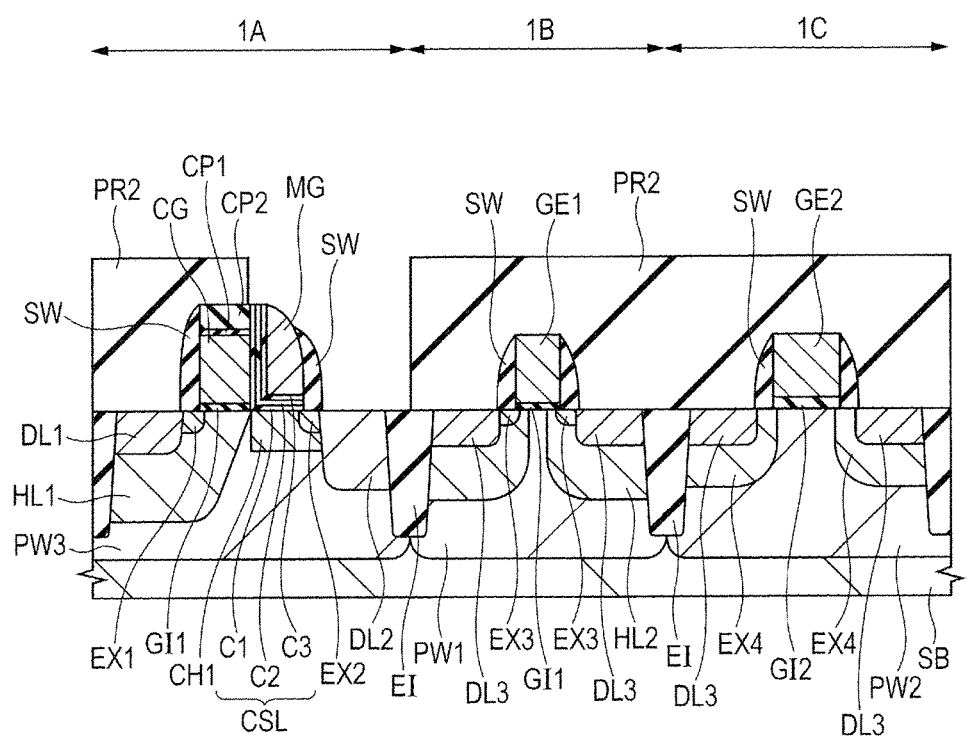
FIG. 21 is a sectional view of a step next to the step shown in FIG. 20 in the semiconductor device manufacturing process.
Figure 22:
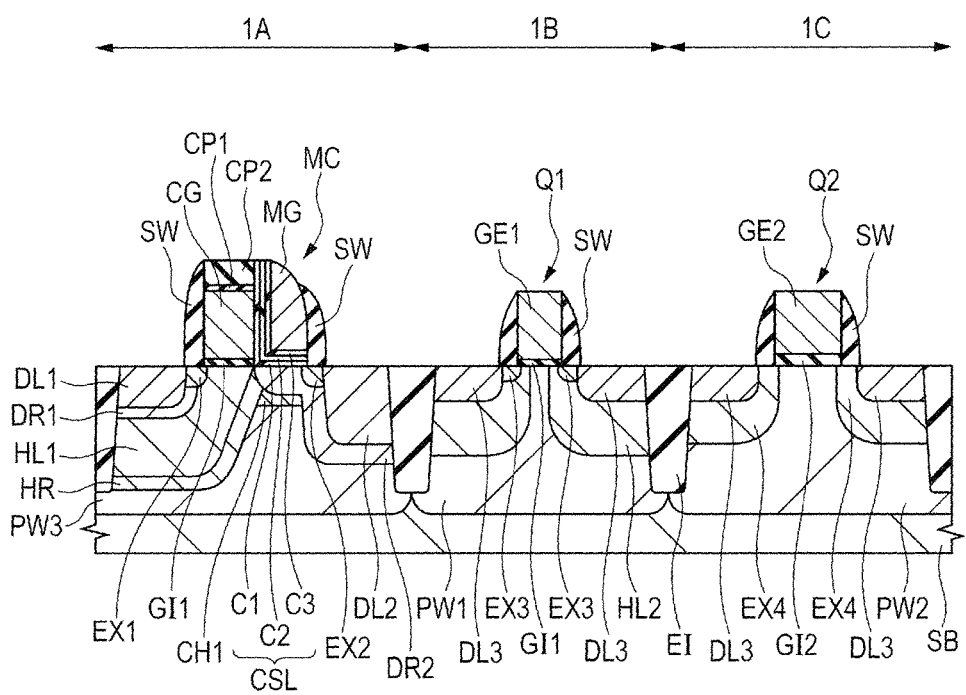
FIG. 22 is a sectional view of a step next to the step shown in FIG. 21 in the semiconductor device manufacturing process.

Next, referring to FIGS. 20 to 22, a second embodiment will be described in which the diffusion layer of the drain region in the memory cell and the diffusion layers of the source/drain regions of the low-voltage MIS transistor and high-voltage MIS transistor are formed in the same ion implantation step. FIGS. 20 to 22 are sectional views of steps in the semiconductor device manufacturing process according to the second embodiment. In FIGS. 20 to 22, a memory cell region 1A, low-voltage MIS region 1B, and high-voltage MIS region 1C are shown as in FIGS. 1 to 17.

In the semiconductor device manufacturing process according to the second embodiment, first the same steps as the steps described above referring to FIGS. 1 to 10 are carried out.

Then, as shown in FIG. 20, a photoresist film PR4 is formed to partially cover the memory cell region 1A and entirely expose the main surface of the semiconductor substrate SB in the low-voltage MIS region 1B and the high-voltage MIS region 1C. In the memory cell region 1A, the photoresist film PR4 covers the main surface of the semiconductor substrate SB at least in an area adjacent to the memory gate electrode MG. The photoresist film PR4 also covers the upper surface of the memory gate electrode MG. The photoresist film PR4 also exposes the main surface of the semiconductor substrate SB in an area adjacent to the control gate electrode CG and exposes the upper surface of the silicon nitride film CP2.

Then, using the photoresist film PR4, silicon nitride film CP2, sidewalls SW, and gate electrodes GE1 and GE2 as a mask, n-type impurities such as As (arsenic) or P (phosphorous) are implanted into the upper surface of the semiconductor substrate SB. A diffusion layer DL1 is thus formed in the main surface of the semiconductor substrate SB on the control gate electrode CG side in the memory cell region 1A, a pair of diffusion layers DL3 are formed in the main surface of the semiconductor substrate SB beside the gate electrode GE1 and a pair of diffusion layers DL3 are formed in the main surface of the semiconductor substrate SB beside the gate electrode GE2.

Next, as shown in FIG. 21, a diffusion layer DL2 is formed in the main surface of the semiconductor substrate SB on the memory gate electrode MG side in the memory cell region 1A by taking the same step as the step described referring to FIG. 12.

Next, as shown in FIG. 22, diffusion regions DR1, DR2, and HR are formed by taking the same step as the step described referring to FIG. 14. A memory cell MC, low-voltage MISQ1 transistor and high-voltage MISQ2 transistor are thus formed. The subsequent steps are the same as the steps described above referring to FIGS. 15 to 17 and the semiconductor device according to the second embodiment is almost finished by taking those steps. The semiconductor device in the second embodiment is structurally the same as in the first embodiment except that the diffusion layers DL1 and DL3 are almost the same in terms of concentration and depth.

As shown in FIG. 22, since the diffusion layers DL1 and DL3 are formed in the same ion implantation step under the same implantation condition, they are almost the same in terms of n-type impurity concentration and formation depth. The semiconductor device manufacturing cost can be reduced by forming the diffusion layer DL1 in the memory cell region 1A, and the diffusion layers DL3 in the low-voltage MIS region 1B and high-voltage MIS region 1C in the same step. This means that the number of steps is smaller than in the process in Comparative Example 1 described above referring to FIGS. 18 and 19 and at the same time the second embodiment brings about the same advantageous effects as the first embodiment.

Third Embodiment

Next, referring to FIGS. 23 to 27, a third embodiment will be described in which the side wall on the control gate electrode side (drain region side) of the memory cell has a smaller width than the side wall on the memory gate electrode side. FIGS. 23 to 27 are sectional views of steps in the semiconductor device manufacturing process according to the third embodiment. In FIGS. 23 to 27, a memory cell region 1A, low-voltage MIS region 1B, and high-voltage MIS region 1C are shown as in FIGS. 1 to 17.

In the semiconductor device manufacturing process according to the third embodiment, first the same steps as the steps described above referring to FIGS. 1 to 9 are carried out.

Figure 23:
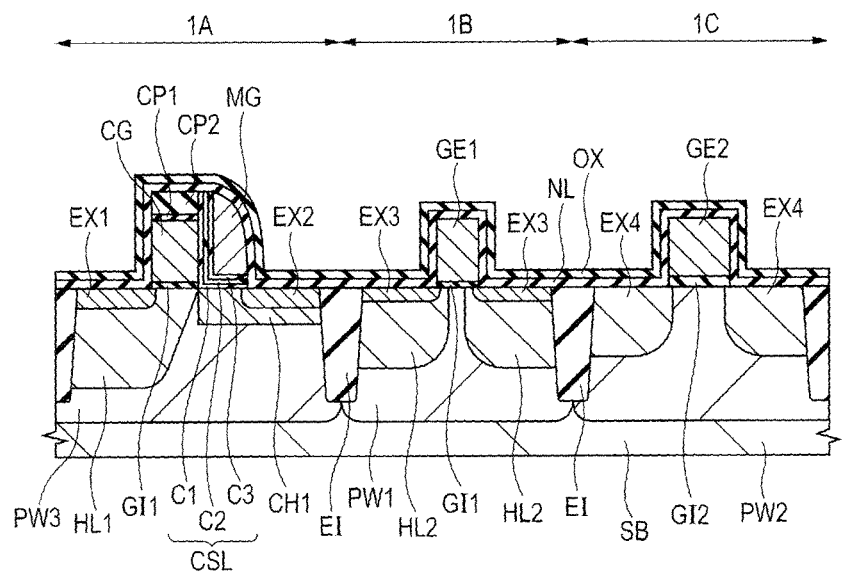
FIG. 23 is a sectional view of a step in a semiconductor device manufacturing process according to a third embodiment of the present invention.

Then, as shown in FIG. 23, a silicon nitride film NL and a silicon oxide film OX are sequentially formed (deposited) over the entire main surface of the semiconductor substrate SB, for example, by the CVD technique.

Figure 24:
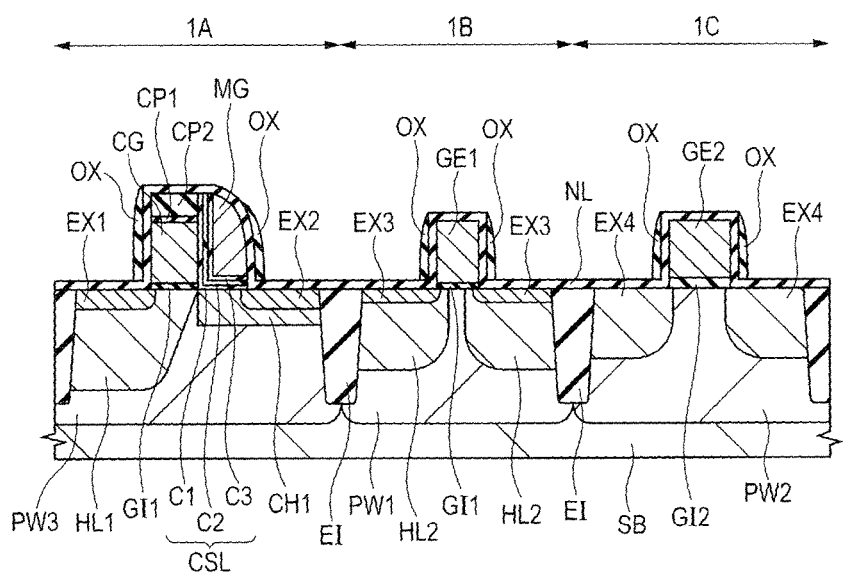
FIG. 24 is a sectional view of a step next to the step shown in FIG. 23 in the semiconductor device manufacturing process.

Then, some portions of the silicon oxide film OX are removed by etching back to expose the upper surface of the silicon nitride film NL as shown in FIG. 24. Other portions of the silicon oxide film OX remain on the sidewalls of the control gate electrode CG, memory gate electrode MG, gate electrodes GE1 and GE2 through the silicon nitride film NL, taking the form of side walls.

Figure 25:
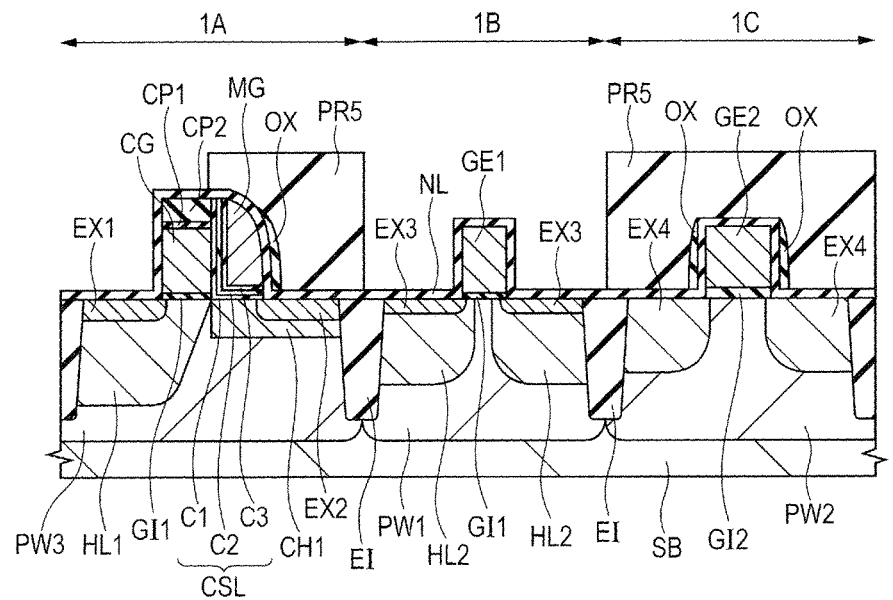
FIG. 25 is a sectional view of a step next to the step shown in FIG. 24 in the semiconductor device manufacturing process.

Then, a photoresist film PR5 is formed as shown in FIG. 25. The photoresist film PR5 is a resist pattern which covers the silicon oxide film OX adjacent to one sidewall of the memory gate electrode MG and both the sidewalls of the gate electrode GE2 through the silicon nitride film NL. The photoresist film PR5 exposes the silicon oxide film OX adjacent to one sidewall of the control gate electrode CG and both the sidewalls of the gate electrode GE2 through the silicon nitride film NL.

Then, using the photoresist film PR5 as a mask, the silicon oxide film OX adjacent to one sidewall of the control gate electrode CG and both the sidewalls of the gate electrode GE1 through the silicon nitride film NL is removed by etching.

Figure 26:
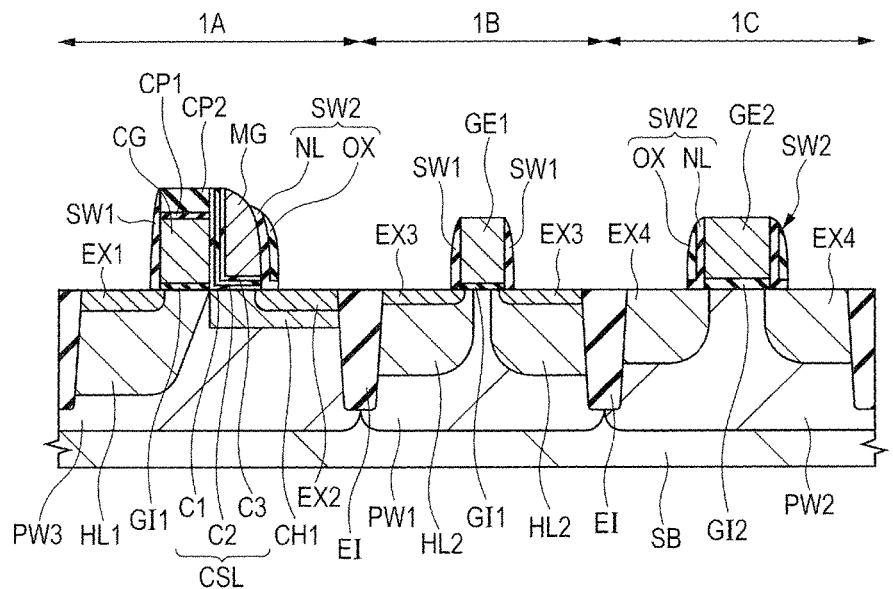
FIG. 26 is a sectional view of a step next to the step shown in FIG. 25 in the semiconductor device manufacturing process.

Next, referring to FIG. 26, after the photoresist film PR5 is removed, etching back is performed on the silicon nitride film NL using the silicon oxide film OX as a mask. The upper surfaces of the semiconductor substrate SB, silicon nitride film CP2, and gate electrodes GE1 and GE2 are exposed by the etch-back step.

Consequently, side walls SW1 of silicon nitride film NL are formed to cover one sidewall of the control gate electrode CG and both the sidewalls of the gate electrode GE1. Also, side walls SW2 of silicon nitride film NL and silicon oxide film OX are formed to cover one sidewall of the memory gate electrode MG and both the sidewalls of the gate electrode GE2.

The width of the side wall SW2 in the gate length direction of the control gate electrode CG is the sum of the thicknesses of the silicon nitride film NL and silicon oxide film OX; on the other hand, the width of the side wall SW1 in the same direction is equal to the thickness of the silicon nitride film NL. In short, the width of the side wall SW2 is larger than the width of the side wall SW1. In the present invention, "width" means a prescribed film length in the direction along the main surface of the semiconductor substrate SB.

Figure 27:
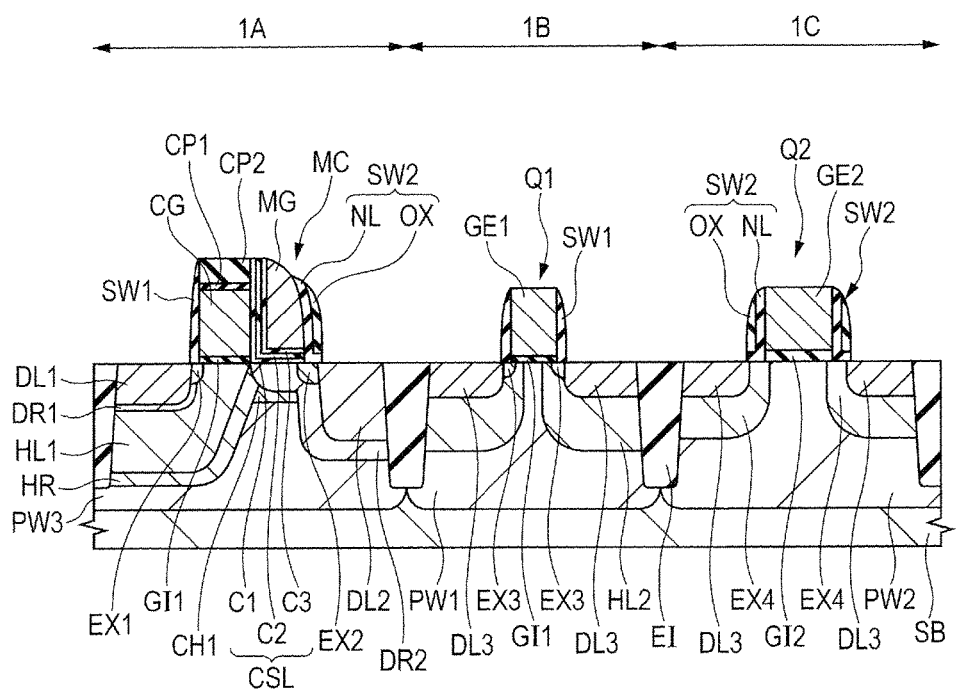
FIG. 27 is a sectional view of a step next to the step shown in FIG. 26 in the semiconductor device manufacturing process.

Next, referring to FIG. 27, the same steps as the steps described above referring to FIGS. 11 to 14 are carried out. Specifically, diffusion layers DL1 to DL3 are formed in various ion implantation steps and then diffusion regions DR1, DR2 and HR are formed by heat treatment. The subsequent steps are the same as the steps described above referring to FIGS. 15 to 17 and the semiconductor device according to the third embodiment is almost finished by taking those steps.

In this embodiment, the diffusion layers DL1 and DL2 have different depths so that the same advantageous effects as in the first embodiment can be achieved. Specifically, the depth of the diffusion layer DL1 of the drain region is small enough to prevent expansion of the extension region DR and thereby prevent the decrease in the channel length. In this embodiment, since the side walls SW1 with a relatively small width are used for ion implantation, the diffusion layer DL1 is nearer to the control gate electrode CG than in the first embodiment, but the above effects prevent worsening of the short channel characteristics.

In other words, it is possible to form a drain region in an area near to the control gate electrode CG while preventing the decrease in threshold voltage due to short channeling. Therefore, the memory cell can be miniaturized and the performance of the semiconductor device is enhanced.

In this embodiment, since the side walls SW2 with a relatively large width are used as a mask for ion implantation, the diffusion layer DL2 is remoter from the memory gate electrode MG than in the first embodiment. This prevents breakdown when a high voltage is applied to the source region. Therefore, the performance of the semiconductor device is enhanced.

The invention made by the present inventors has been so far explained concretely in reference to the preferred embodiments thereof. However, the invention is not limited thereto and it is obvious that these details may be modified in various ways without departing from the gist thereof.

What is claimed is:

1. A method of manufacturing a semiconductor device comprising the steps of:
   (a) providing a semiconductor substrate having a first semiconductor region of first conductivity type in a surface;
   (b) forming a first gate electrode over the semiconductor substrate through a first insulating film;
   (c) forming a second gate electrode adjacent to a first sidewall of the first gate electrode through a second insulating film containing a charge accumulation area, over the semiconductor substrate through the second insulating film;
   (d) forming a second semiconductor region of the first conductivity type in an upper surface of the semiconductor substrate in a first region adjacent to a second sidewall opposite to the first sidewall of the first gate electrode;
   (e) forming a first diffusion layer in the upper surface of the semiconductor substrate in the first region by implanting impurities of second conductivity type different from the first conductivity type;
   (f) forming a second diffusion layer having a larger depth than the first diffusion layer, in the upper surface of the semiconductor substrate in a second region adjacent to a third sidewall of the second gate electrode opposite to the first gate electrode by implanting impurities of the second conductivity type;
   (g) heating the semiconductor substrate after whichever step is last taken among the step (d), the step (e), and the step (f);
   (c1) after the step (c), forming a third semiconductor region in the upper surface of the semiconductor substrate in the first region by implanting impurities of the second conductivity type before whichever step is taken earlier, either the step (e) or the step (f); and
   (c2) after the step (c), forming a fourth semiconductor region in the upper surface of the semiconductor substrate in the second region by implanting impurities of the second conductivity type before whichever step is taken earlier, either the step (e) or the step (f),
   wherein a drain region including the first diffusion layer, a source region including the second diffusion layer, the first gate electrode and the second gate electrode constitute a memory cell of a nonvolatile memory,
   wherein in the step (g), a first diffusion region of the second conductivity type covering the first diffusion layer and a second diffusion region of the second conductivity type covering the second diffusion layer are formed in the semiconductor substrate by diffusing impurities of the second conductivity type in each of the first diffusion layer and the second diffusion layer by heating,
   wherein an impurity concentration of the second conductivity type of the third semiconductor region is lower than the impurity concentration of the second conductivity type of the first diffusion layer, and
   wherein the impurity concentration of the second conductivity type of the fourth semiconductor region is lower than the impurity concentration of the second conductivity type of the second diffusion layer.

2. The method of manufacturing a semiconductor device according to claim 1, wherein an impurity concentration of the second conductivity type of the second diffusion layer is higher than the impurity concentration of the second conductivity type of the first diffusion layer.

3. The method of manufacturing a semiconductor device according to claim 1, wherein the second diffusion region is nearer to the first diffusion layer than the fourth semiconductor region in a main surface of the semiconductor substrate.

4. The method of manufacturing a semiconductor device according to claim 3, wherein in the main surface of the semiconductor substrate, an end of the first diffusion region on the second diffusion region side is nearer to the first diffusion layer than an end of the third semiconductor region on the second diffusion region side.

5. The method of manufacturing a semiconductor device according to claim 1, wherein the fourth semiconductor region is covered by the second diffusion region and the second diffusion layer.

6. The method of manufacturing a semiconductor device according to claim 1, further comprising the step of:
   (d1) after whichever step is taken later, either the step (c1) or the step (c2), forming a first side wall covering the second sidewall and a second side wall covering the third sidewall before whichever step is taken earlier, either the step (e) or the step (f).

7. The method of manufacturing a semiconductor device according to claim 6, wherein width of the first side wall in a gate length direction of the first gate electrode is smaller than the width of the second side wall in the gate length direction.

8. The method of manufacturing a semiconductor device according to claim 1, further comprising the steps of:
   (c3) before the step (d), forming a third gate electrode over the semiconductor substrate through a third insulating film; and
   (e1) before the step (g), forming a pair of third diffusion layers in the upper surface of the semiconductor substrate beside the third gate electrode by implanting impurities of the second conductivity type,
   wherein the pair of third diffusion layers and the third gate electrode constitute a field effect transistor.

9. The method of manufacturing a semiconductor device according to claim 8, wherein an impurity concentration of the second conductivity type of the third diffusion layer is higher than the impurity concentration of the second conductivity type of the first diffusion layer.

10. The method of manufacturing a semiconductor device according to claim 1, further comprising the step of:
    (c3) before the step (d), forming a third gate electrode over the semiconductor substrate through a third insulating film,
    wherein in the step (e), the first diffusion layer and a pair of third diffusion layers beside the third gate electrode are formed in the upper surface of the semiconductor substrate in the first region and the upper surface of the semiconductor substrate beside the third gate electrode by implanting impurities of the second conductivity type, and
    wherein the pair of third diffusion layers and the third gate electrode constitute a field effect transistor.

11. The method of manufacturing a semiconductor device according to claim 1, wherein the second semiconductor region and the second diffusion region abut on each other.

12. The method of manufacturing a semiconductor device according to claim 1, wherein the first diffusion region and the first gate electrode are spaced from each other in a plan view.

13. A method of manufacturing a semiconductor device comprising the steps of:

(a) providing a semiconductor substrate having a first semiconductor region of first conductivity type in a surface;
(b) forming a first gate electrode over the semiconductor substrate through a first insulating film;
(c) forming a second gate electrode adjacent to a first sidewall of the first gate electrode through a second insulating film containing a charge accumulation area, over the semiconductor substrate through the second insulating film;
(d) forming a second semiconductor region of the first conductivity type in an upper surface of the semiconductor substrate in a first region adjacent to a second sidewall opposite to the first sidewall of the first gate electrode;
(e) forming a first diffusion layer in the upper surface of the semiconductor substrate in the first region by implanting impurities of second conductivity type different from the first conductivity type;
(f) forming a second diffusion layer having a higher impurity concentration of the second conductivity type than the first diffusion layer, in the upper surface of the semiconductor substrate in a second region adjacent to a third sidewall of the second gate electrode opposite to the first gate electrode by implanting impurities of the second conductivity type; and
(g) after whichever step is last taken among the step (d), the step (e), and the step (f), forming a first diffusion region of the second conductivity type covering the first diffusion layer and a second diffusion region of the second conductivity type covering the second diffusion layer in the semiconductor substrate by diffusing impurities of the second conductivity type in each of the first diffusion layer and the second diffusion layer by heating the semiconductor substrate,
wherein a drain region including the first diffusion layer, a source region including the second diffusion layer, the first gate electrode and the second gate electrode constitute a memory cell of a nonvolatile memory, and
wherein in a direction perpendicular to the upper surface of the semiconductor substrate, distance from a bottom of the second diffusion layer to a bottom of the second diffusion region is larger than the distance from a bottom of the first diffusion layer to a bottom of the first diffusion region.

* * * * *